(12) United States Patent
Kim et al.

(10) Patent No.: US 11,171,135 B2
(45) Date of Patent: Nov. 9, 2021

(54) SEMICONDUCTOR DEVICE

(71) Applicant: SAMSUNG ELECTRONICS CO., LTD., Suwon-si (KR)

(72) Inventors: Hyojin Kim, Hwaseong-si (KR); Jihye Lee, Suwon-si (KR); Sangmoon Lee, Suwon-si (KR); Seung Hun Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/896,423

(22) Filed: Jun. 9, 2020

(65) Prior Publication Data

US 2021/0118880 A1    Apr. 22, 2021

(30) Foreign Application Priority Data

Oct. 18, 2019   (KR) .................. 10-2019-0130171

(51) Int. Cl.
*H01L 27/092*    (2006.01)
*H01L 29/161*    (2006.01)

(52) U.S. Cl.
CPC .......... *H01L 27/092* (2013.01); *H01L 29/161* (2013.01)

(58) Field of Classification Search
CPC ....... H01L 29/16; H01L 29/161; H01L 27/09; H01L 27/092

USPC ....................................................... 257/341
See application file for complete search history.

(56) References Cited

U.S. PATENT DOCUMENTS

| | | |
|---|---|---|
| 9,412,814 B2 | 8/2016 | Lee et al. |
| 9,502,532 B2 * | 11/2016 | Park ..................... H01L 29/165 |
| 9,660,082 B2 | 5/2017 | Chang et al. |
| 9,691,898 B2 | 6/2017 | Sung et al. |
| 9,768,302 B2 | 9/2017 | Sung et al. |
| 10,008,568 B2 | 6/2018 | Chen et al. |
| 10,186,579 B2 | 1/2019 | Min et al. |
| 2017/0110327 A1 | 4/2017 | Kim et al. |
| 2019/0043967 A1 | 2/2019 | Mulfinger et al. |

* cited by examiner

*Primary Examiner* — Monica D Harrison
(74) *Attorney, Agent, or Firm* — Lee IP Law, P.C.

(57) ABSTRACT

A semiconductor device including a substrate; a first active pattern on the substrate and extending in a first direction, an upper portion of the first active pattern including a first channel pattern; first source/drain patterns in recesses in an upper portion of the first channel pattern; and a gate electrode on the first active pattern and extending in a second direction crossing the first direction, the gate electrode being on a top surface and on a side surface of the at least one first channel pattern, wherein each of the first source/drain patterns includes a first, second, and third semiconductor layer, which are sequentially provided in the recesses, each of the first channel pattern and the third semiconductor layers includes silicon-germanium (SiGe), and the first semiconductor layer has a germanium concentration higher than those of the first channel pattern and the second semiconductor layer.

20 Claims, 41 Drawing Sheets

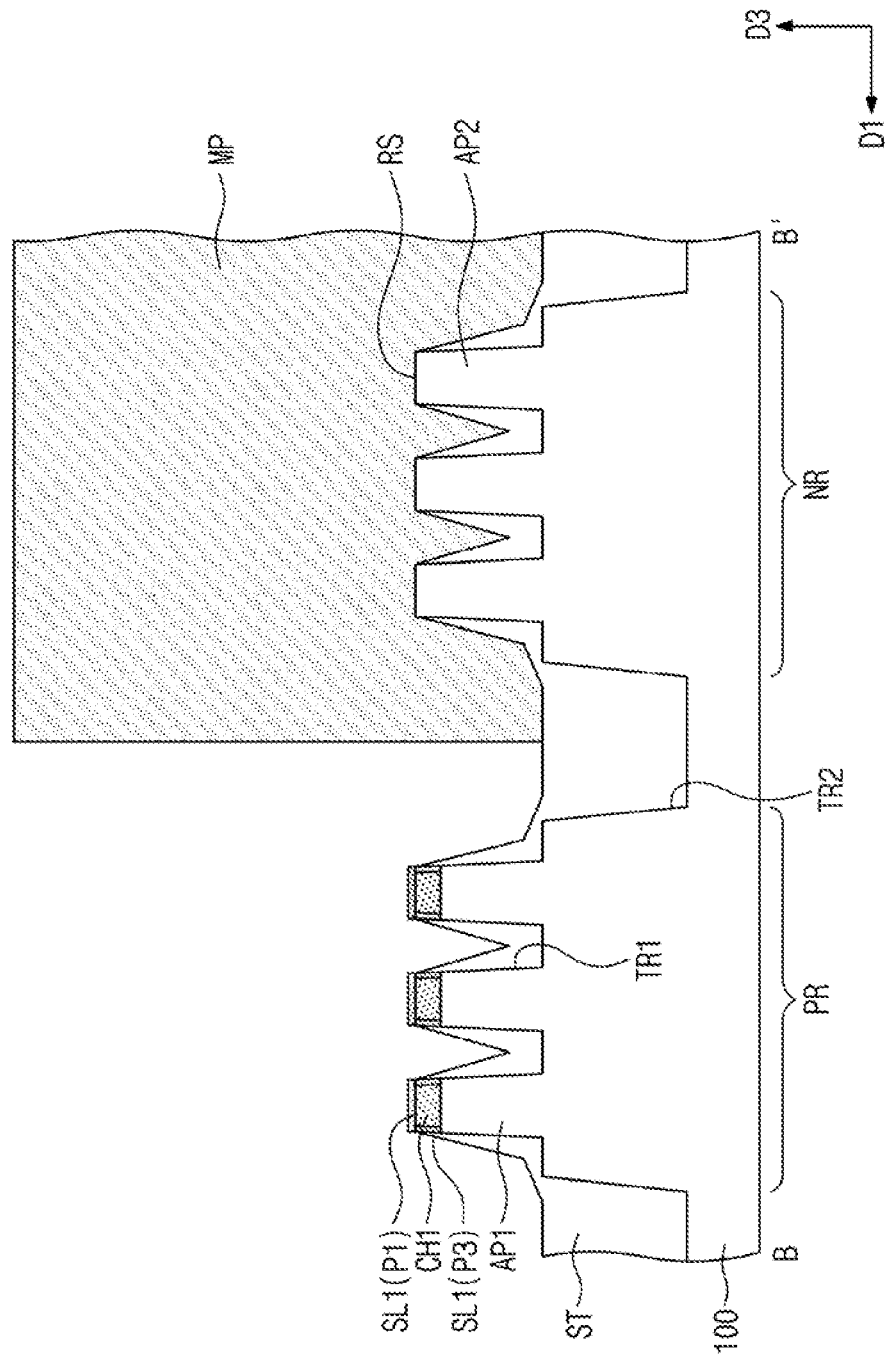

180
SEMICONDUCTOR DEVICE

CROSS-REFERENCE TO RELATED APPLICATIONS

Korean Patent Application No. 10-2019-0130171, filed on Oct. 18, 2019, in the Korean Intellectual Property Office, and entitled: "Semiconductor Device," is incorporated by reference herein in its entirety.

BACKGROUND

1. Field

Embodiments relate to a semiconductor device.

2. Description of the Related Art

Due to their small-size, multifunctional, and/or low-cost characteristics, semiconductor devices are being esteemed as important elements in the electronic industry. The semiconductor devices may include, e.g., a semiconductor memory device for storing data, a semiconductor logic device for processing data, and a hybrid semiconductor device including both of memory and logic elements. As the electronic industry advances, there is an increasing demand for semiconductor devices with improved characteristics.

SUMMARY

The embodiments may be realized by providing a semiconductor device including a substrate; a first active pattern on the substrate and extending in a first direction, an upper portion of the first active pattern including at least one first channel pattern; first source/drain patterns in recesses in an upper portion of the at least one first channel pattern; and a gate electrode on the first active pattern and extending in a second direction crossing the first direction, the gate electrode being on a top surface and on at least one side surface of the at least one first channel pattern, wherein each of the first source/drain patterns includes a first semiconductor layer, a second semiconductor layer, and a third semiconductor layer, which are sequentially provided in the recesses, each of the at least one first channel pattern, the first semiconductor layer, the second semiconductor layer, and the third semiconductor layer includes silicon-germanium (SiGe), and the first semiconductor layer has a germanium concentration higher than those of the at least one first channel pattern and the second semiconductor layer.

The embodiments may be realized by providing a semiconductor device including a substrate; a first active pattern on the substrate and extending in a first direction; first source/drain patterns in recesses in an upper portion of the first active pattern; and a gate electrode on the first active pattern and extending in a second direction crossing the first direction, the gate electrode being on a top surface and at least one side surface of the first active pattern, wherein each of the first source/drain patterns includes a first semiconductor layer and a second semiconductor layer, which are sequentially provided in the recesses, the first semiconductor layer has a germanium concentration higher than that of the second semiconductor layer, the first active pattern includes a first channel pattern at an upper portion thereof, the first channel pattern includes a pair of first surfaces that face the first source/drain patterns, and a pair of second surfaces that connect the pair of first surfaces to each other and are overlapped with the gate electrode, and the first semiconductor layer includes first portions on the first surfaces and second portions on the second surfaces.

The embodiments may be realized by providing a semiconductor device including a substrate; a first active pattern on the substrate and extending in a first direction, an upper portion of the first active pattern including a first channel pattern; first source/drain patterns in recesses in an upper portion of the first channel pattern; a gate electrode on the first active pattern and extending in a second direction crossing the first direction, the gate electrode being on a top surface and at least one side surface of the first channel pattern, an active contact connected to the first source/drain pattern; and an interface layer between the active contact and the first source/drain pattern, wherein each of the first source/drain patterns includes a first semiconductor layer, a second semiconductor layer, and a third semiconductor layer, which are sequentially provided on the recesses, each of the first channel pattern, the first semiconductor layer, the second semiconductor layer, and the third semiconductor layer includes silicon-germanium (SiGe), a germanium concentration of the third semiconductor layer is higher than that of the second semiconductor layer, a germanium concentration of the first semiconductor layer is higher than those of the first active pattern and the second semiconductor layer, the first channel pattern includes a pair of first surfaces, which face the first source/drain patterns, and a pair of second surfaces, which connect the pair of first surfaces to each other and are overlapped with the gate electrode, and the first semiconductor layer includes first portions on the first surfaces and second portions on the second surfaces.

BRIEF DESCRIPTION OF THE DRAWINGS

Features will be apparent to those of skill in the art by describing in detail exemplary embodiments with reference to the attached drawings in which:

FIGS. 14B, 16B, 18B, 20B, 22B, and 24B illustrate sectional views taken along lines B-B' of FIGS. 13, 15, 17, 19, 21, and 23, respectively.

DETAILED DESCRIPTION

Figure 1:
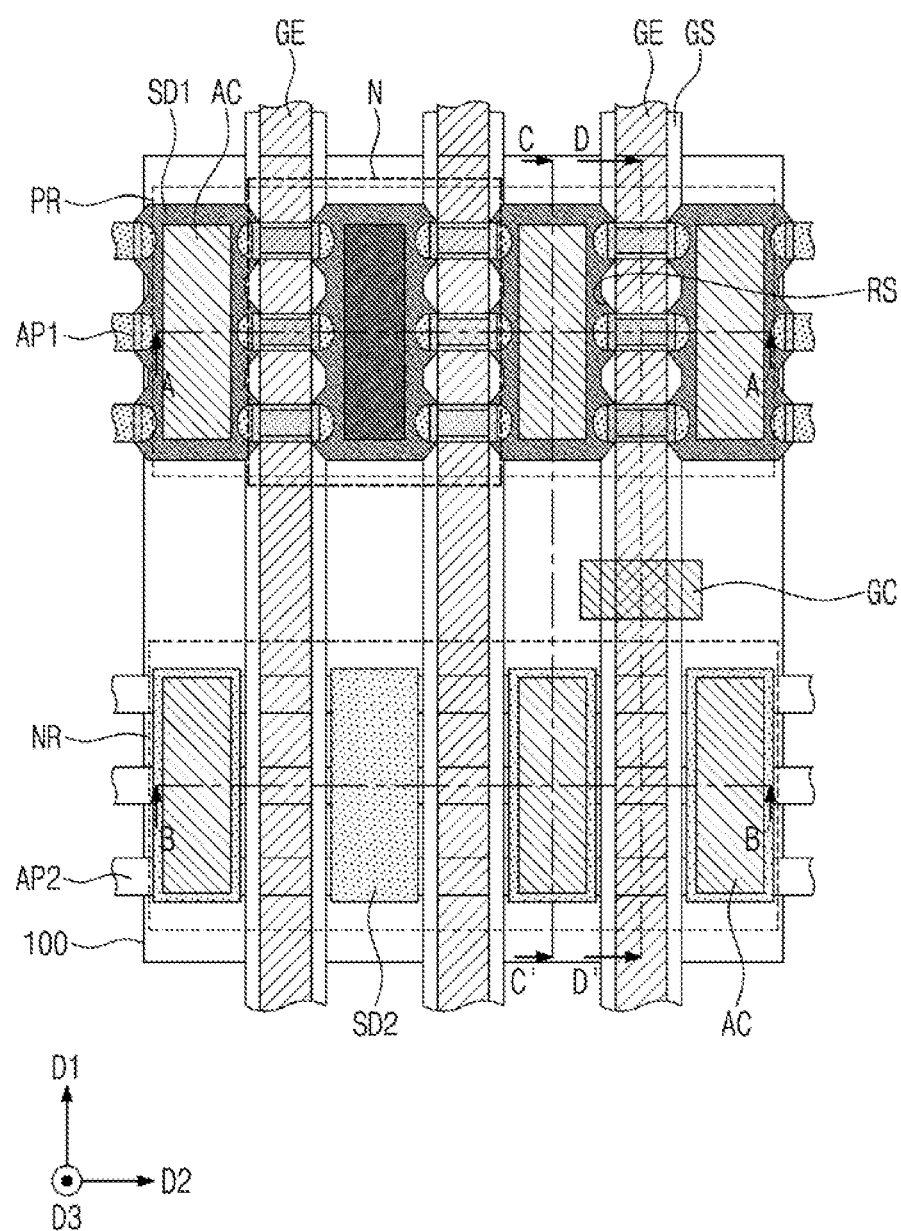
FIG. 1 illustrates a plan view of a semiconductor device according to an embodiment.
Figure 3:
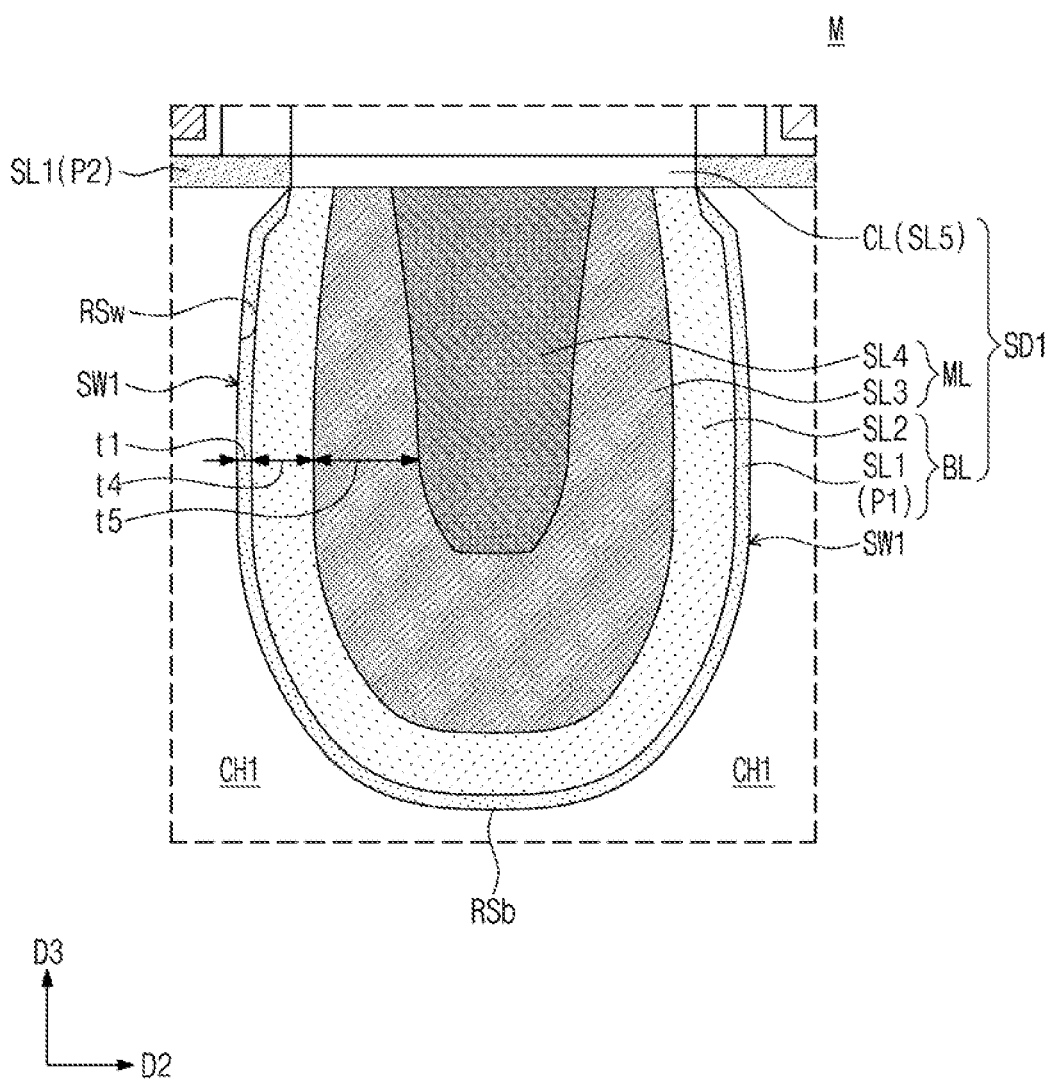
FIG. 3 illustrates an enlarged sectional view of a region 'M' of FIG. 2A.
Figure 4:
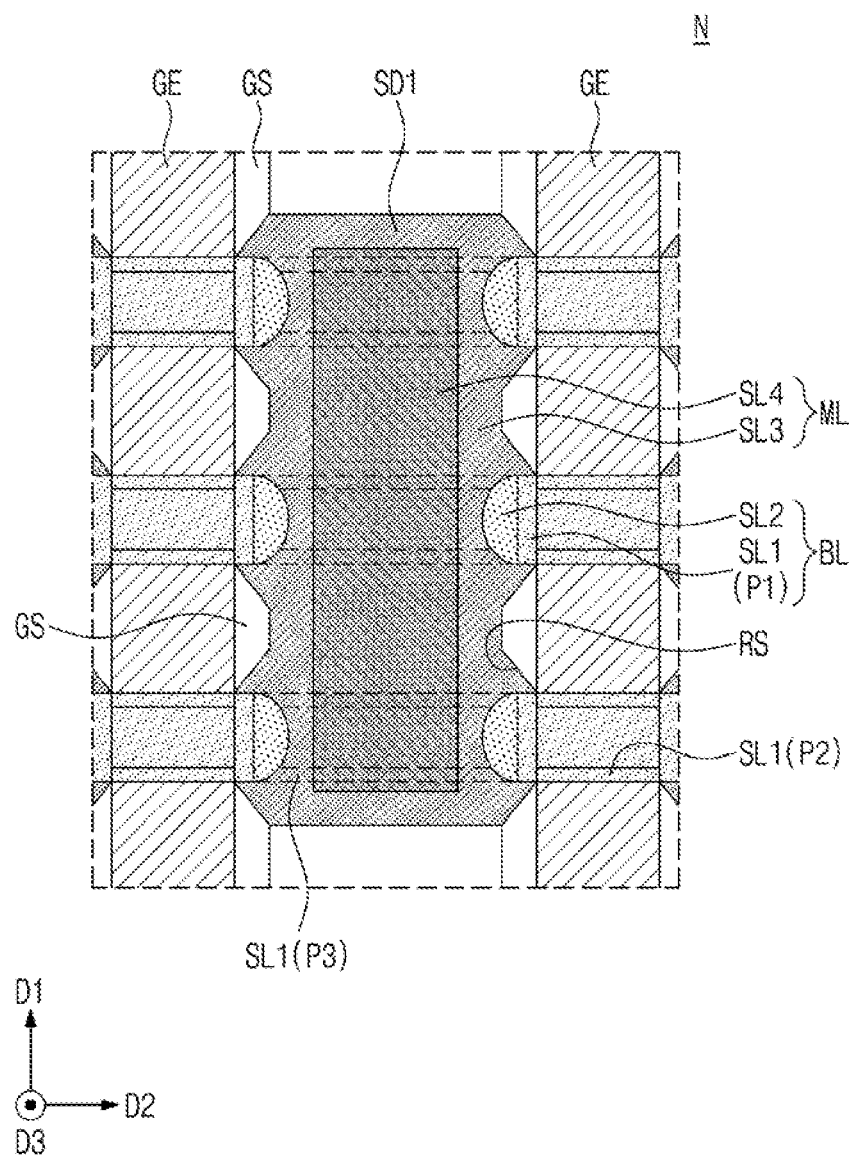
FIG. 4 illustrates an enlarged plan view of a region 'N' of FIG. 1.
Figure 5:
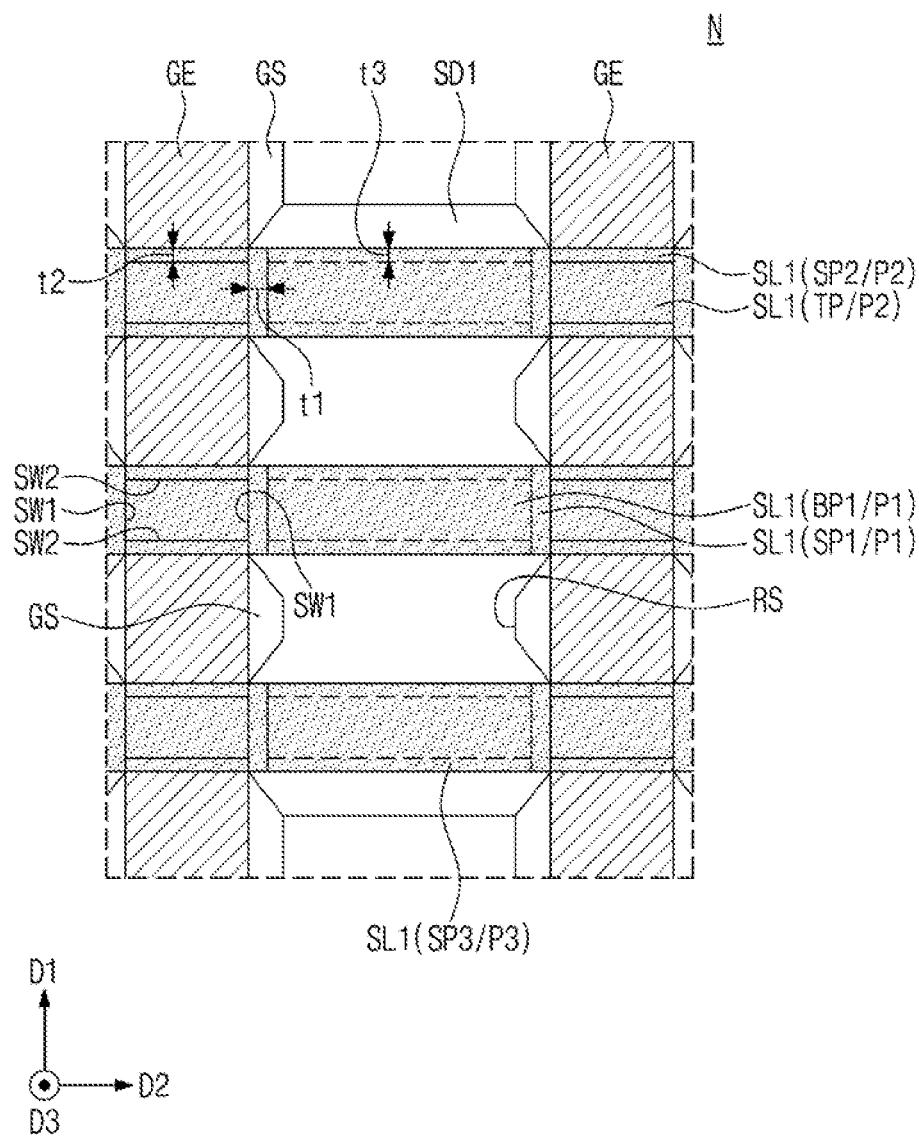
FIGS. 5 and 6 illustrate enlarged plan views of first and second semiconductor layers, respectively, which are provided in the region 'N'.
Figure 6:
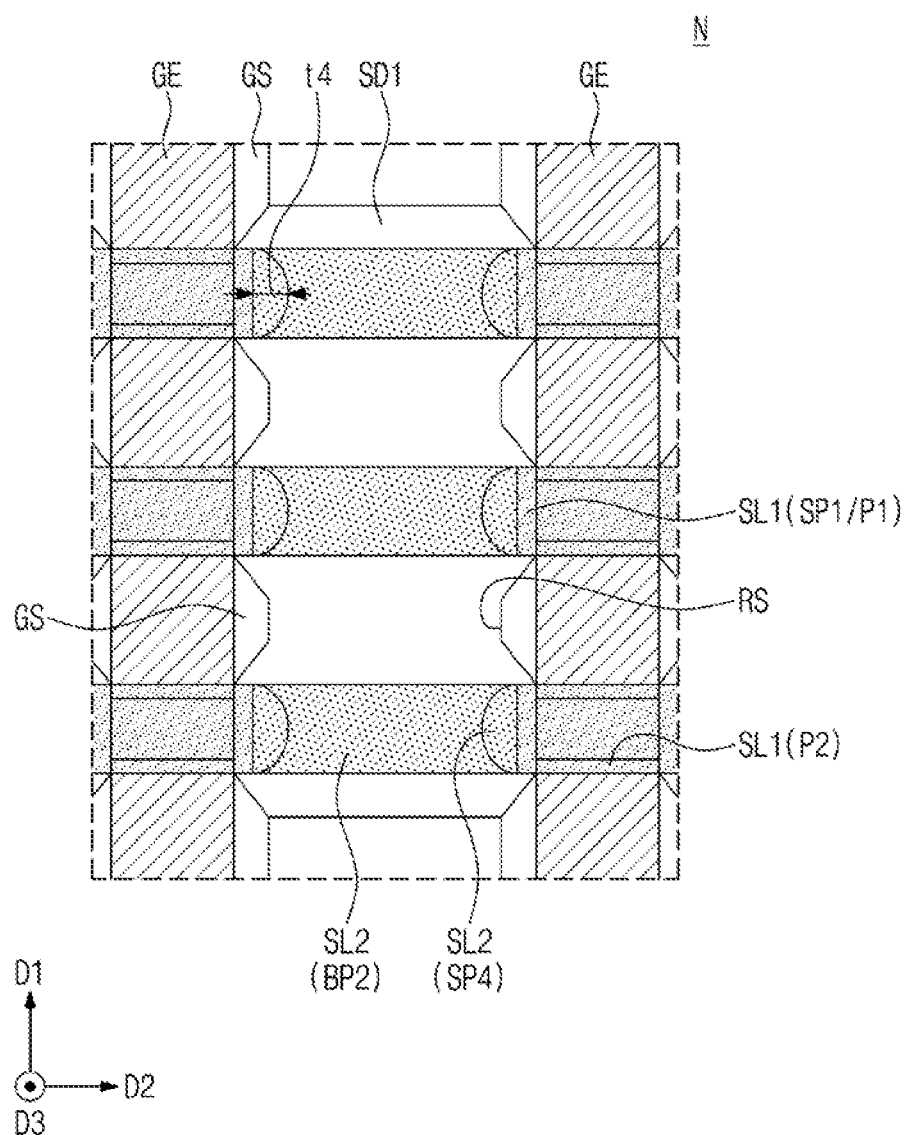
Figure 7:
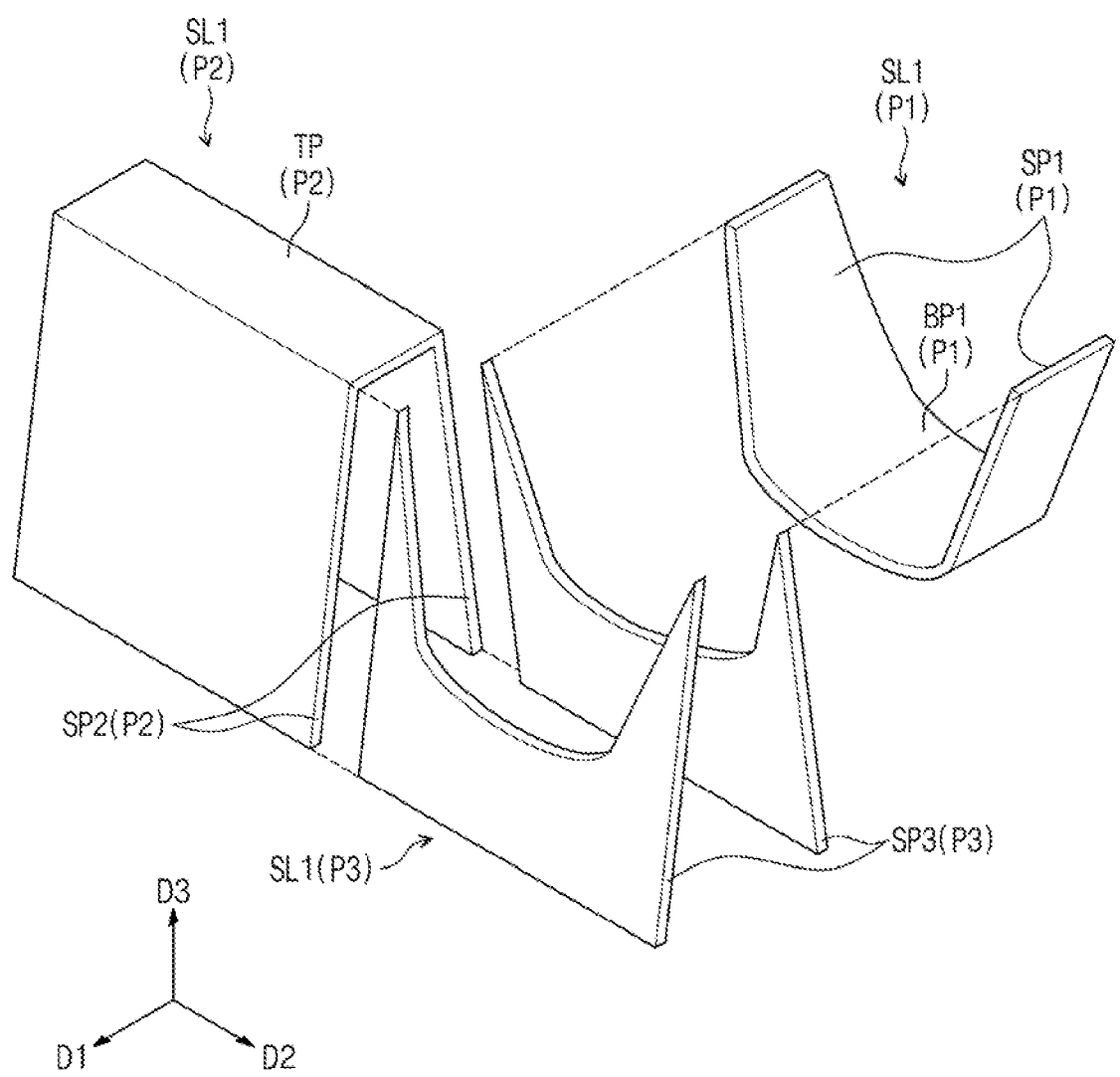
FIG. 7 illustrates a perspective view of a first semiconductor layer.

FIG. 1 is a plan view of a semiconductor device according to an embodiment. FIGS. 2A to 2D are sectional views taken along lines A-A', B-B', C-C', and D-D', respectively, of FIG. 1. FIG. 3 is an enlarged sectional view of a region 'M' of FIG. 2A. FIG. 4 is an enlarged plan view of a region 'N' of FIG. 1. FIGS. 5 and 6 are enlarged plan views illustrating first and second semiconductor layers, respectively, which are provided in the region 'N'. FIG. 7 is a perspective view of a first semiconductor layer.

Referring to FIGS. 1, 2A to 2D, and 3, a substrate 100 including a first active region PR and a second active region NR may be provided. The substrate 100 may be a semiconductor substrate made of, e.g., silicon, germanium, silicon-germanium, or a compound semiconductor material. In an implementation, the substrate 100 may be a silicon wafer.

In an implementation, the first and second active regions PR and NR may be logic cell regions, on which logic transistors will be formed. In an implementation, the logic transistors may constitute a logic circuit of the semiconductor device. In an implementation, the logic transistors constituting the logic circuit may be on the logic cell region of the substrate 100. The first and second active regions PR and NR may include some of the logic transistors. The first active region PR may be a PMOSFET region, and the second active region NR may be an NMOSFET region.

The first and second active regions PR and NR may be defined (e.g., separated) by a second trench TR2, which is formed in an upper portion of the substrate 100. The second trench TR2 may be between the first and second active regions PR and NR. The first and second active regions PR and NR may be spaced apart from each other in a first direction D1 with the second trench TR2 therebetween. Each of the first and second active regions PR and NR may extend (e.g., lengthwise) in a second direction D2 crossing the first direction D1.

First active patterns AP1 and second active patterns AP2 may be on the first active region PR and the second active region NR, respectively. The first and second active patterns AP1 and AP2 may extend (e.g., lengthwise) in the second direction D2 and may be parallel to each other. The first and second active patterns AP1 and AP2 may include vertically-protruding portions of the substrate 100. Each of the upper portions of the first and second active patterns AP1 and AP2 may be shaped like a fin. A first trench TR1 may be defined between adjacent ones of the first active patterns AP1 and between adjacent ones of the second active patterns AP2. The first trench TR1 may be shallower than the second trench TR2 (e.g., with respect to an upper surface of the substrate 100 in a vertical or third direction D3).

Each of the first active patterns AP1 may include an upper portion, a portion of which is a first channel pattern CH1. The first channel patterns CH1 may be formed of or include a semiconductor material different from the substrate 100. In an implementation, in the case where the substrate 100 is a silicon substrate, the first channel patterns CH1 may be formed of or include silicon-germanium. The first channel patterns CH1 may include silicon-germanium, and mobility of electric charges in the first channel patterns CH1 may be increased.

Lower portions of the first active patterns AP1, which are located below the first channel patterns CH1 (e.g., in the third direction D3), may be protruding patterns, which vertically extend from the substrate 100. In an implementation, second channel patterns CH2, which are the upper portions of the second active patterns AP2, may be portions of the substrate 100 and may be formed of or include silicon.

A device isolation layer ST may fill the first and second trenches TR1 and TR2. The device isolation layer ST may be formed of or include silicon oxide. The upper portions of the first and second active patterns AP1 and AP2 may be protruding patterns, which are vertically extended above the device isolation layer ST (e.g., in the third direction, see FIG. 2D). The device isolation layer ST may not cover the upper portions of the first and second active patterns AP1 and AP2. The device isolation layer ST may cover side surfaces of lower portions of the first and second active patterns AP1 and AP2. In an implementation, the lower portions of the first channel patterns CH1 may be covered with the device isolation layer ST.

First source/drain patterns SD1 may be provided in or on the upper portions of the first active patterns AP1. The first source/drain patterns SD1 may be impurity regions of a first conductivity type (e.g., p-type). The first source/drain patterns SD1 may be provided in or on the upper portion of the first channel pattern CH1. Second source/drain patterns SD2 may be provided in or on the upper portions of the second active patterns AP2. The second source/drain patterns SD2 may be impurity regions of a second conductivity type (e.g., n-type). The second channel pattern CH2 may be between each pair of the second source/drain patterns SD2. The second channel patterns CH2 may correspond to the upper portions of the second active patterns AP2.

The first and second source/drain patterns SD1 and SD2 may be epitaxial patterns, which may be formed by a selective epitaxial growth (SEG) process. In an implementation, the first and second source/drain patterns SD1 and SD2 may have top surfaces that are coplanar with top surfaces of the first and second channel patterns CH1 and CH2. In an implementation, the top surfaces of the first and second source/drain patterns SD1 and SD2 may be higher than (e.g., in the third direction D3) the top surfaces of the first and second channel patterns CH1 and CH2.

The first source/drain patterns SD1 may include a semiconductor element (e.g., Ge), whose lattice constant is larger than a lattice constant of a semiconductor element (e.g., Si) in the substrate 100. In an implementation, the first source/drain patterns SD1 may be formed of or include silicon-germanium. The first source/drain patterns SD1 may exert a compressive stress on the first channel patterns CH1. In an implementation, the second source/drain patterns SD2 may, e.g., include the same semiconductor element (e.g., Si) as the substrate 100.

Gate electrodes GE may cross the first and second active patterns AP1 and AP2 and extend (e.g., lengthwise) in the first direction D1. The gate electrodes GE may be spaced apart from each other in the second direction D2. The gate electrodes GE may be overlapped with the first and second channel patterns CH1 and CH2, when viewed in a plan view. Each of the gate electrodes GE may face a top surface and opposite side surfaces of respective ones of the first and second channel patterns CH1 and CH2.

Referring back to FIG. 2D, the gate electrode GE may be on a first top surface TS1 and at least one side surface of the first channel pattern CH1. The gate electrode GE may be on a second top surface TS2 and at least one side surface of the second channel pattern CH2. A transistor according to the present embodiment may be a three-dimensional field-effect transistor (e.g., FinFET), in which the gate electrode GE three-dimensionally surrounds the channel patterns CH1 and CH2.

Referring back to FIGS. 1, 2A to 2D, and 3, a pair of gate spacers GS may be on both side surfaces of each of the gate electrodes GE. The gate spacers GS may extend along the gate electrodes GE and in the first direction D1. Top surfaces of the gate spacers GS may be higher than top surfaces of the gate electrodes GE (e.g., in the third direction D3). The top surfaces of the gate spacers GS may be coplanar with a top surface of a first interlayered insulating layer 110, which will be described below. The gate spacers GS may be formed of or include at least one of SiCN, SiCON, or SiN. In an implementation, the gate spacers GS may be a multi-layered structure, which includes at least two different materials selected from SiCN, SiCON, and SiN. As used herein, the term "or" is not an exclusive term, e.g., "A or B" would include A, B, or A and B.

A gate capping pattern GP may be on each of the gate electrodes GE. The gate capping pattern GP may extend along the gate electrode GE and in the first direction D1. The gate capping pattern GP may be formed of or include a material that has etch selectivity with respect to first and second interlayered insulating layers 110 and 120 to be described below. In an implementation, the gate capping patterns GP may be formed of or include at least one of SiON, SiCN, SiCON, or SiN.

A gate dielectric pattern GI may be between the gate electrode GE and the first active pattern AP1 and between the gate electrode GE and the second active pattern AP2. The gate dielectric pattern GI may extend along a bottom surface of the gate electrode GE thereon. In an implementation, the gate dielectric pattern GI may cover the first top surface TS1 and the side surface of the first channel pattern CH1. The gate dielectric pattern GI may cover the second top surface TS2 and the side surface of the second channel pattern CH2. The gate dielectric pattern GI may cover a top surface of the device isolation layer ST below the gate electrode GE (e.g., see FIG. 2D).

In an implementation, the gate dielectric pattern GI may be formed of or include a high-k dielectric material, whose dielectric constant is higher than that of a silicon oxide layer. In an implementation, the high-k dielectric material may include, e.g., hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

In an implementation, the gate dielectric pattern GI may be formed of or include a ferroelectric material. The gate dielectric pattern GI including the ferroelectric material may serve as a negative capacitor. The ferroelectric material of the gate dielectric pattern GI may include hafnium oxide, which contains (or is doped) with zirconium (Zr), silicon (Si), aluminum (Al), or lanthanum (La).

The gate electrode GE may include a first metal pattern and a second metal pattern on the first metal pattern. The first metal pattern may be on the gate dielectric pattern GI and may be adjacent to the first and second channel patterns CH1 and CH2. The first metal pattern may include a work function metal, which may help adjust a threshold voltage of the transistor. By adjusting a thickness and composition of the first metal pattern, it is possible to realize a transistor having a desired threshold voltage.

The first metal pattern may include a metal nitride layer. In an implementation, the first metal pattern may include nitrogen (N) and at least one metal, e.g., titanium (Ti), tantalum (Ta), aluminum (Al), tungsten (W), or molybdenum (Mo). The first metal pattern may further include carbon (C). The first metal pattern may include a plurality of work function metal layers, which are stacked.

The second metal pattern may include a metallic material, whose resistance is lower than the first metal pattern. In an implementation, the second metal pattern may include, e.g., tungsten (W), aluminum (Al), titanium (Ti), or tantalum (Ta).

A first semiconductor layer SL1 may be between the gate dielectric pattern GI and the first channel patterns CH1. In an implementation, a second portion P2 of the first semiconductor layer SL1 may be between the gate dielectric pattern GI and the first channel patterns CH1. The second portion P2 of the first semiconductor layer SL1 may cover the first top surface TS1 and the side surface of the first channel patterns CH1, as shown in FIG. 2D. The second portion P2 of the first semiconductor layer SL1 may be connected to a first portion P1 and a third portion P3, which will be described below, as shown in FIG. 7.

The first interlayered insulating layer 110 may be on the substrate 100. The first interlayered insulating layer 110 may cover the gate spacers GS and the first and second source/drain patterns SD1 and SD2. A top surface of the first interlayered insulating layer 110 may be substantially coplanar with the top surfaces of the gate capping patterns GP and the top surfaces of the gate spacers GS. The second interlayered insulating layer 120 may be on the first interlayered insulating layer 110 to cover the gate capping patterns GP. A third interlayered insulating layer 130 may be on the second interlayered insulating layer 120. In an implementation, the first to third interlayered insulating layers 110, 120, and 130 may be formed of or include silicon oxide.

Active contacts AC may penetrate the first and second interlayered insulating layers 110 and 120 and may be electrically connected to the first and second source/drain patterns SD1 and SD2, respectively. Each of the active contacts AC may be between a pair of the gate electrodes GE.

The active contact AC may be a self-aligned contact. In an implementation, the active contact AC may be formed by a self-alignment process using the gate capping pattern GP and the gate spacer GS. In an implementation, the active contact AC may cover at least a portion of a side surface of the gate spacer GS. In an implementation, the active contact AC may cover a portion of the top surface of the gate capping pattern GP.

An interface pattern SC may be between the active contact AC and the first source/drain pattern SD1 and between the active contact AC and the second source/drain pattern SD2. The active contact AC may be electrically connected to the first or second source/drain pattern SD1 or SD2 through the interface pattern SC. The interface pattern SC may be formed of or include at least one of metal-silicide materials (e.g., titanium-silicide, tantalum-silicide, tungsten-silicide, nickel-silicide, or cobalt-silicide).

At least one gate contact GC may be on (e.g., over or aligned with) the device isolation layer ST filling the second trench TR2. The gate contact GC may penetrate the second interlayered insulating layer 120 and the gate capping pattern GP and may be electrically connected to the gate electrode GE.

Each of the active and gate contacts AC and GC may include a conductive pattern FM and a barrier pattern BM enclosing the conductive pattern FM. In an implementation, the conductive pattern FM may be formed of or include a metal, e.g., aluminum, copper, tungsten, molybdenum, or cobalt. The barrier pattern BM may cover side and bottom surfaces of the conductive pattern FM. The barrier pattern BM may include a metal layer or a metal nitride layer. The metal layer may be formed of or include titanium, tantalum, tungsten, nickel, cobalt, or platinum. The metal nitride layer may be formed of or include titanium nitride (TiN), tantalum nitride (TaN), tungsten nitride (WN), nickel nitride (NiN), cobalt nitride (CoN), or platinum nitride (PtN).

A first interconnection layer may be in the third interlayered insulating layer 130. The first interconnection layer may include a plurality of interconnection lines IL and a plurality of vias VI below the interconnection lines IL. The interconnection lines IL may extend (e.g., lengthwise) in the second direction D2 and may be parallel to each other. The interconnection lines IL may be arranged (e.g., spaced apart) in the first direction D1.

The via VI may be between a first interconnection line, which is one of the interconnection lines IL, and the active contact AC. The first interconnection line may be electrically connected to the active contact AC through the via VI. The via VI may also be between a second interconnection line, which is another of the interconnection lines IL, and the gate contact GC. The second interconnection line may be electrically connected to the gate contact GC through the via VI.

In an implementation, a plurality of interconnection layers may be additionally stacked on the first interconnection layer. Logic cells constituting the logic circuit may be connected to each other through the first interconnection layer and the additionally-stacked interconnection layers.

Hereinafter, the first source/drain pattern SD1 will be described in more detail with reference to FIGS. 2A, 2C, and 3 to 7. A recess RS may be formed in the upper portion of the first active pattern AP1 (e.g., the first channel pattern CH1). In an implementation, a plurality of recesses RS may be formed in the upper portion of each of the first channel patterns CH1. The first source/drain pattern SD1 may be provided in the recess RS.

The first source/drain pattern SD1 may include a buffer layer BL, a main layer ML on the buffer layer BL, and a capping layer CL on the main layer ML. In an implementation, the buffer layer BL may include first and second semiconductor layers SL1 and SL2. The main layer ML may include third and fourth semiconductor layers SL3 and SL4. The capping layer CL may include a fifth semiconductor layer SL5. In an implementation, the fourth semiconductor layer SL4 may be omitted, and the main layer ML may be composed of a single semiconductor layer. The main layer ML may be on the buffer layer BL and may cover an inner side surface of the buffer layer BL. The main layer ML may fill (e.g., remaining portions of) the recess RS. The capping layer CL may cover the top surface of the main layer ML. The capping layer CL may be conformally formed on an exposed surface of the main layer ML. The capping layer CL may help protect the main layer ML.

As shown in FIG. 3, the recess RS may include a pair of inner side surfaces RSw and a bottom surface RSb between the pair of the inner side surfaces RSw. The buffer layer BL may cover the inner side surface RSw and the bottom surface RSb of the recess RS. When viewed in a sectional view taken in the second direction D2, the buffer layer BL may have a 'U'-shape section.

Referring to FIGS. 2C, 2D, and 3 to 6, the first channel patterns CH1 may include a pair of first side surfaces SW1 (e.g., FIG. 3), which face the first source/drain pattern SD1, and second side surfaces SW2 (e.g., See FIG. 2D), which are overlapped with the gate electrode GE. The first portion P1 of the first semiconductor layer SL1 may cover the first side surfaces SW1, and the second portion P2 of the first semiconductor layer SL1 may cover the second side surfaces SW2. In an implementation, when viewed in a plan view, four surfaces of the first channel pattern CH1 may be covered with the first semiconductor layer SL1.

The first portion P1 of the first semiconductor layer SL1 may be a part of the first source/drain pattern SD1 and may be in the recess RS. The first portion P1 of the first semiconductor layer SL1 may include opposite side portions SP1 and a bottom portion BP1, as shown in FIG. 7. The second portion P2 of the first semiconductor layer SL1 may cover a first top surface T1 and the second side surfaces SW2 of the first channel patterns CH1. The second portion P2 of the first semiconductor layer SL1 may include opposite side portions SP2 and a top portion TP. The side portions SP1 of the first portion P1 may be connected to surfaces of the second portion P2, which is exposed in the second direction D2.

The first semiconductor layer SL1 may include the third portion P3, which is extended from the second portion P2 to a region below the first portion P1. The third portion P3 may be formed concurrently with the second portion P2, as will be described below, and may be a part of the upper portion of the first semiconductor layer SL1 removed by the recess RS. The third portion P3 may include side portions SP3, which are located below the first portion P1 and cover side surfaces of the first channel patterns CH1. In an implementation, the third portion P3 may be omitted.

As shown in FIG. 5, a first thickness t1 (in the second direction D2) of the first portion P1 may be greater than a second thickness t2 (in the first direction D1) of the second portion P2. In an implementation, the first thickness t1 may be about 1.1 to 3 times the second thickness t2. In an implementation, the first thickness t1 may be substantially equal to the second thickness t2. A third thickness t3 (in the first direction D1) of the third portion P3 may be substantially equal to the second thickness t2. Each of the first to third thickness t1, t2, and t3 and a fourth thickness to be described below may be the largest thickness of a corresponding layer or portion.

The first semiconductor layer SL1 may include a plurality of portions, which are separately and respectively provided on the first channel patterns CH1 spaced apart from each other in the first direction D1. In an implementation, the first portions P1, which are on the first channel patterns CH1 adjacent to each other in the first direction D1, may be spaced apart from each other.

The second semiconductor layer SL2 may be provided on each of the first portions P1 of the first semiconductor layer SL1. In an implementation, the second semiconductor layer SL2 may include a plurality of portions, which are separately and respectively provided on the first channel patterns CH1 spaced apart from each other in the first direction D1. The second semiconductor layer SL2 may include side portions SP4, which are on the side portions SP1 of the first portion P1 of the first semiconductor layer SL1, and a bottom portion BP2, which is on the bottom portion BP1 of the first portion P1 of the first semiconductor layer SL1.

As shown in FIGS. 3 and 6, a fourth thickness t4 (in the second direction D2) of the second semiconductor layer SL2 may be greater than the first thickness t1 of the first portion P1 of the first semiconductor layer SL1. In an implementation, the fourth thickness t4 may be about two to seven times the first thickness t1. In an implementation, the first thickness t1 may range from about 1 nm to about 3 nm, and the fourth thickness t4 may range from about 3 nm to about 9 nm. The thickness of the first semiconductor layer SL1 may be adjusted by a thermal treatment process, which will be described below. Maintaining the first thickness t1 at about 1 nm or greater may help prevent an impurity diffusion issue, which will be described below. Maintaining the first thickness t1 at about 5 nm or less may help reduce the possibility of and/or prevent the occurrence of a stacking fault between the first semiconductor layer SL1 and the first channel patterns CH1 or between the first semiconductor layer SL1 and the second semiconductor layer SL2.

As shown in FIG. 4, the third semiconductor layer SL3 may be a single layer covering the first portions P1 of the first semiconductor layer SL1, which are separated from each other in the first direction D1. Similarly, the second semiconductor layers SL2, which are separated from each other in the first direction D1, may be in common contact with the third semiconductor layer SL3. In an implementation, the first portions P1, which are separately provided on the first channel patterns CH1 separated from each other in the first direction D1, may be connected in common to the third semiconductor layer SL3 through the second semiconductor layers SL2. A fifth thickness t5 (in the second direction D2) of the third semiconductor layer SL3 may be greater than the fourth thickness t4 of the second semiconductor layer SL2. In an implementation, the fifth thickness t5 of the third semiconductor layer SL3 may range from 20 nm to 40 nm.

Each of the first channel patterns CH1, the buffer layer BL, and the main layer ML may include a semiconductor element whose lattice constant is greater than a lattice constant of a semiconductor element of the substrate 100. In an implementation, in the case where the substrate 100 includes silicon (Si), the first channel patterns CH1, the buffer layer BL, and the main layer ML may include silicon germanium (SiGe). The lattice constant of the germanium (Ge) may be greater than the lattice constant of the silicon (Si).

A germanium concentration of the second semiconductor layer SL2 may be higher than a germanium concentration of the first channel pattern CH1. A germanium concentration of the third semiconductor layer SL3 may be higher than the germanium concentration of the second semiconductor layer SL2. In an implementation, the germanium concentration of the third semiconductor layer SL3 may be higher than a germanium concentration of the first semiconductor layer SL1. A germanium concentration of the fourth semiconductor layer SL4 may be higher than the germanium concentration of the third semiconductor layer SL3. The germanium concentration of the first semiconductor layer SL1 may be higher than the germanium concentration of the first channel pattern CH1 and the germanium concentration of the second semiconductor layer SL2. The germanium concentration of the first semiconductor layer SL1 may be lower than the germanium concentration of the third semiconductor layer SL3. A concentration of germanium (Ge) in the main layer ML may increase in the third direction D3.

The germanium concentration of the first channel pattern CH1 may range from, e.g., about 15 at % to about 30 at %. The germanium concentration of the first semiconductor layer SL1 may range from, e.g., about 30 at % to about 50 at %. The germanium concentration of the second semiconductor layer SL2 may range from, e.g., about 20 at % to about 30 at %. The germanium concentration of the third semiconductor layer SL3 may range from, e.g., about 45 at % to about 60 at %. The germanium concentration of the fourth semiconductor layer SL4 may range from, e.g., about 50 at % to about 70 at %.

Portions of the first channel pattern CH1, which are in contact with the first semiconductor layer SL1 (e.g., portions adjacent to or at a surface of the first channel pattern CH1), may have a germanium concentration lower than other portions of the first channel pattern CH1. Both of the first and second portions P1 and P2 of the first semiconductor layer SL1 may have the germanium concentration higher than those of the first channel pattern CH1 and the second semiconductor layer SL2. The first and second portions P1 and P2 of the first semiconductor layer SL1 may have substantially the same germanium concentration. In an implementation, the first and second portions P1 and P2 of the first semiconductor layer SL1 may have different germanium concentrations from each other. In an implementation, the germanium concentration of the first portion P1 of the first semiconductor layer SL1 may be higher than the germanium concentration of the second portion P2 of the first semiconductor layer SL1.

The buffer layer BL and the main layer ML may include impurities (e.g., boron), allowing the first source/drain pattern SD1 to have the p-type conductivity. A concentration (e.g., atomic percent) of impurities in the main layer ML may be higher than that in the buffer layer BL.

The fifth semiconductor layer SL5 (of the capping layer CL) may include the same semiconductor element as that in the substrate 100. As an example, the fifth semiconductor layer SL5 may include single crystalline silicon (Si). A concentration of silicon (Si) in the fifth semiconductor layer SL5 may range from 95 at % to 100 at %. A concentration of germanium (Ge) in the fifth semiconductor layer SL5 may range from 0 at % to 5 at %. In an implementation, germanium (Ge) in the fourth semiconductor layer SL4 may be diffused into the fifth semiconductor layer SL5, and in this case, the fifth semiconductor layer SL5 may contain a tiny amount of germanium (Ge) (e.g., lower than 5 at %).

Figure 2A:
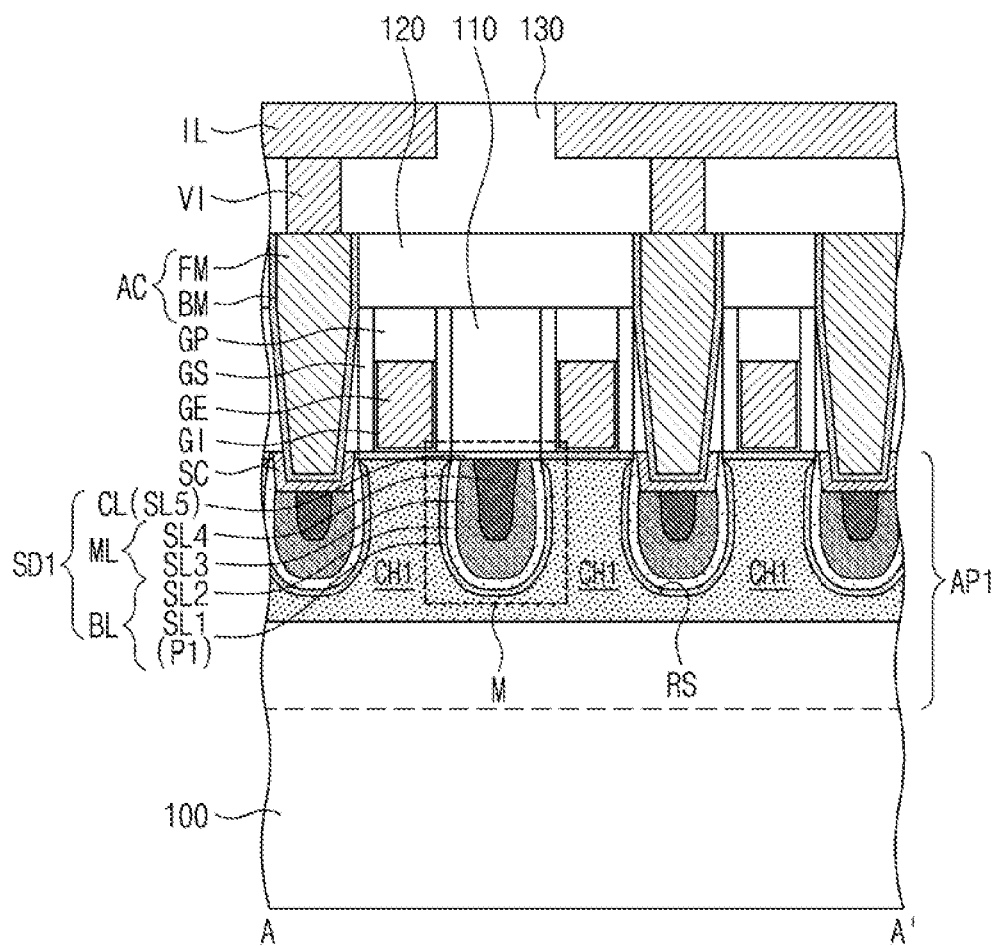
FIGS. 2A to 2D illustrate sectional views taken along lines A-A', B-B', C-C', and D-D', respectively, of FIG. 1.
Figure 2A:
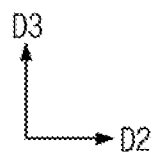
Figure 2B:
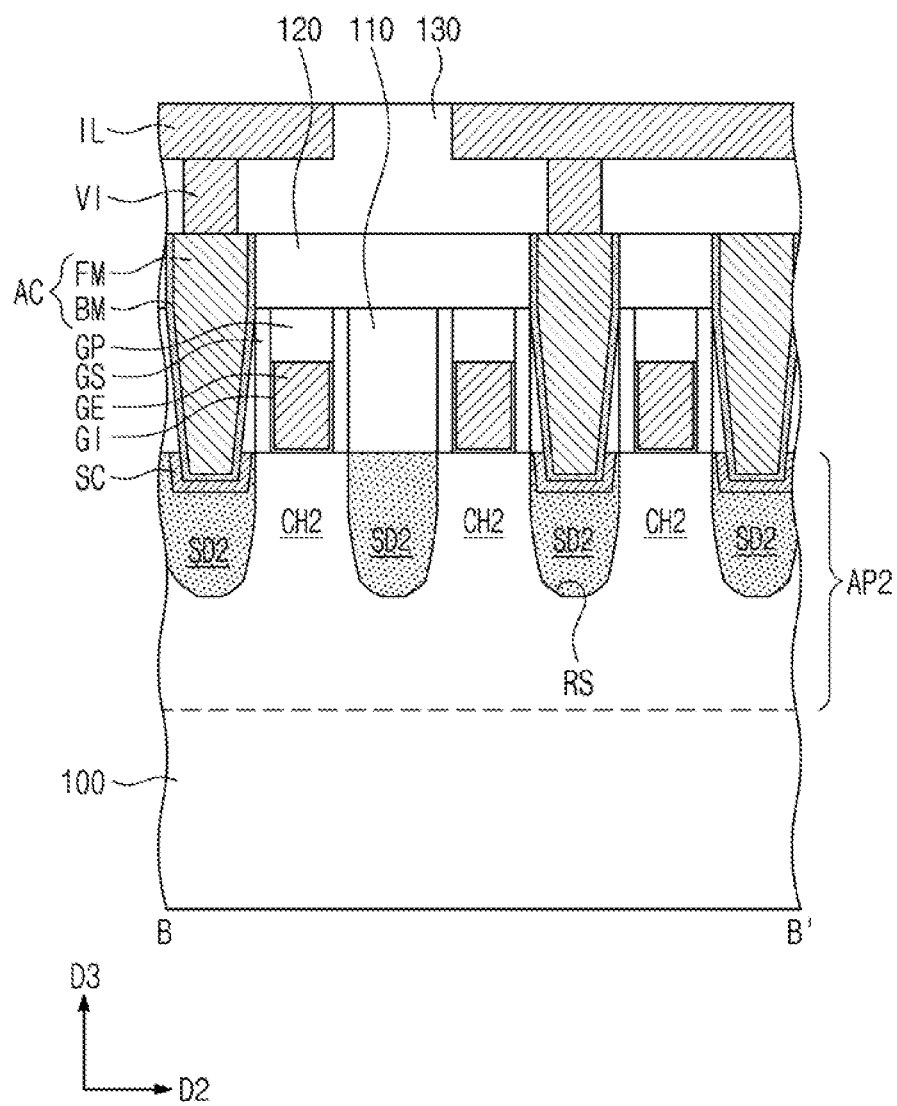
Figure 2C:
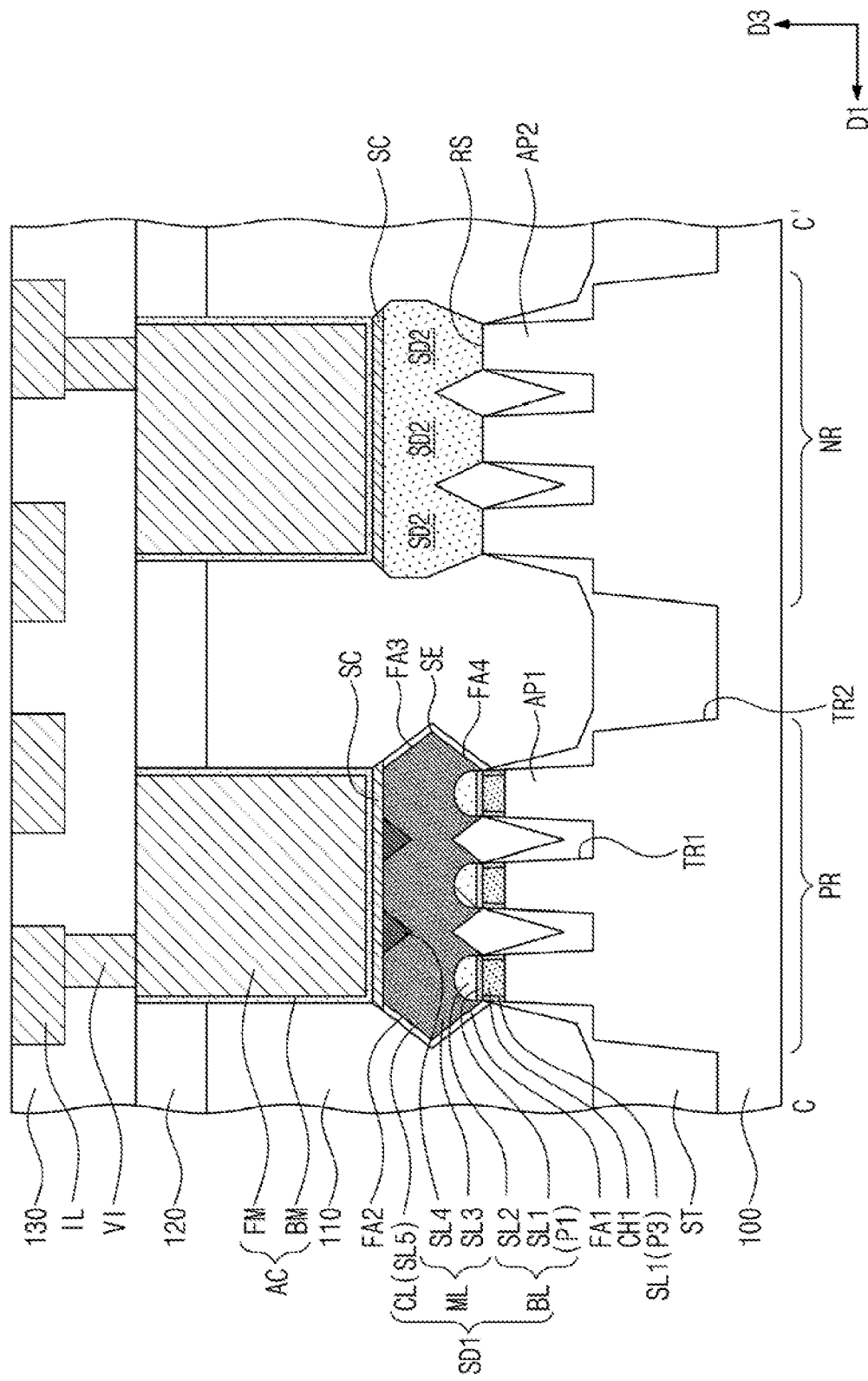
Figure 2D:
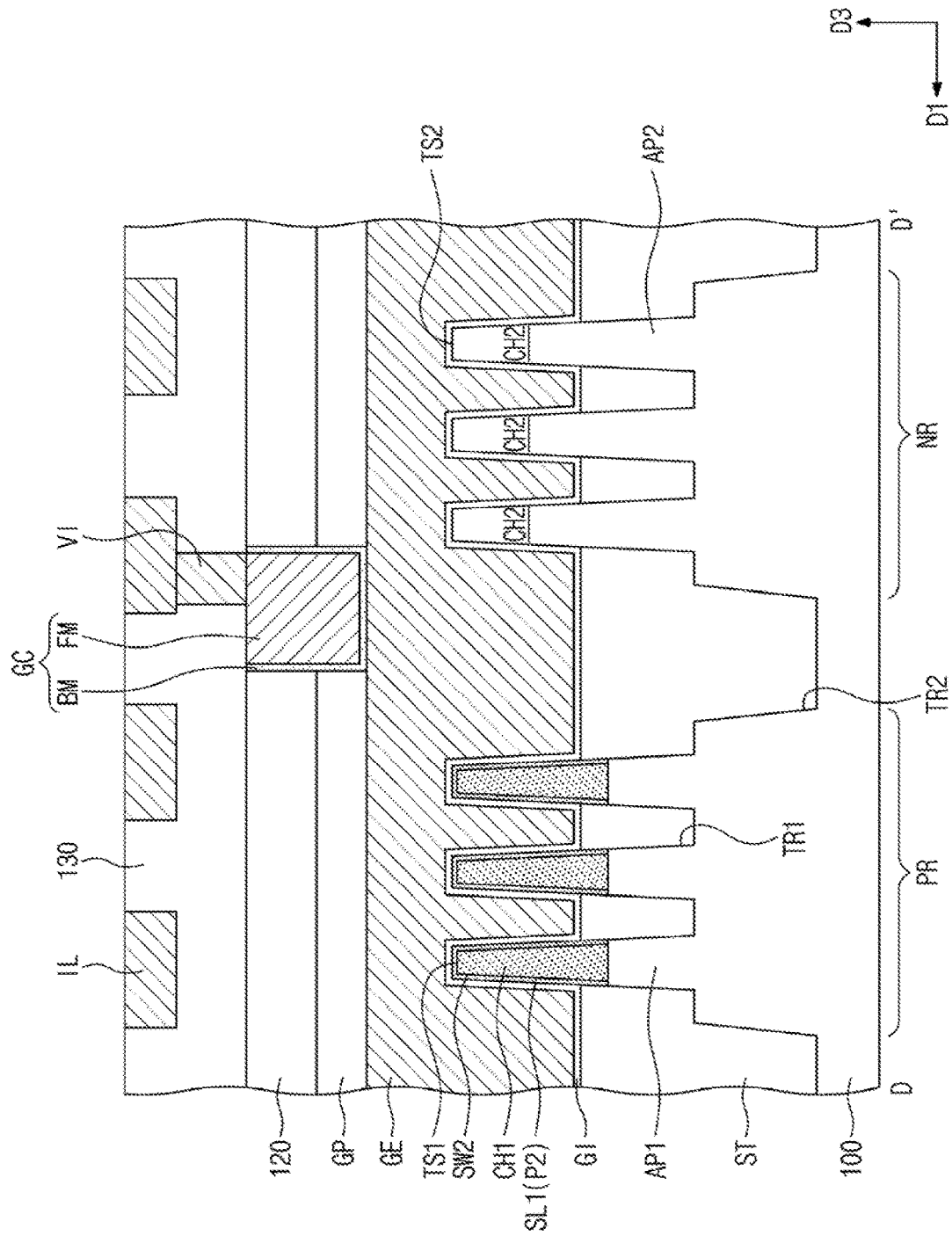

Referring further to FIG. 2C, the main layer ML may be on the first active patterns AP1. In an implementation, a plurality of main layers ML, which are respectively on the first active patterns AP1, may be merged to form a single main layer ML on the first active patterns AP1.

The main layer ML may include a first facet FA1, a second facet FA2, a third facet FA3, and a fourth facet FA4. The first to fourth facets FA1-FA4 may be surfaces of the third semiconductor layer SL3. The first to fourth facets FA1-FA4 may be substantially the same crystal plane. The first to fourth facets FA1-FA4 may be the (111) crystal planes.

A corner SE of the main layer ML may be defined by the first facet FA1 and the second facet FA2 and/or by the third facet FA3 and the fourth facet FA4. The corner SE may horizontally protrude in a direction away from the first active pattern AP1. In an implementation, the corner SE may protrude in a direction parallel to the first direction D1.

The capping layer CL may be on the main layer ML. The capping layer CL may cover the first to fourth facets FA1-FA4 of the main layer ML. The capping layer CL may cover the corner SE of the main layer ML. The first source/drain pattern SD1 may have the largest width in the first direction D1, at a level of the corner SE of the main layer ML.

The interface pattern SC and the active contact AC may be on the first source/drain pattern SD1. In an implementation, the interface pattern SC may be in contact with not only the top surface of the main layer ML but also the top surface of the capping layer CL. In an implementation, a contact area between the first source/drain pattern SD1 and the interface pattern SC may be increased, due to the capping layer CL.

Figure 8:
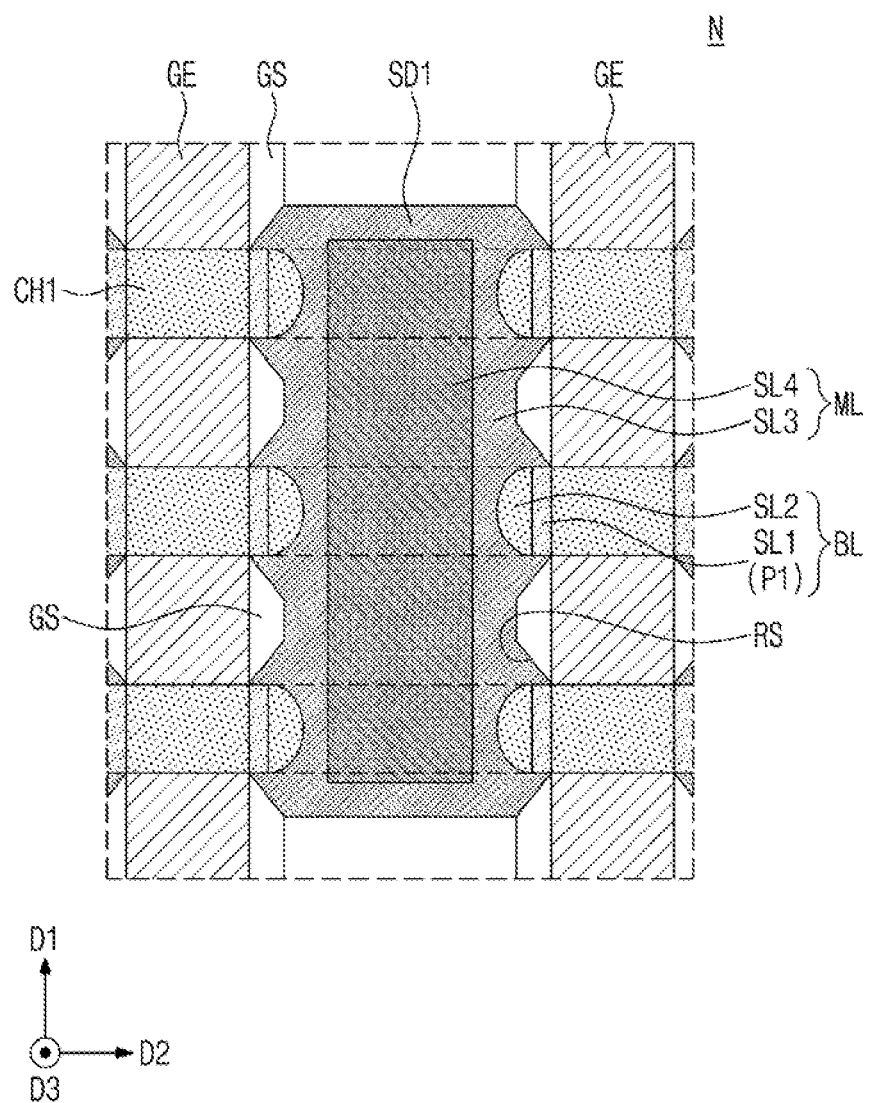
FIG. 8 illustrates an enlarged plan view of the region 'N' of FIG. 1, according to another embodiment.
Figure 9:
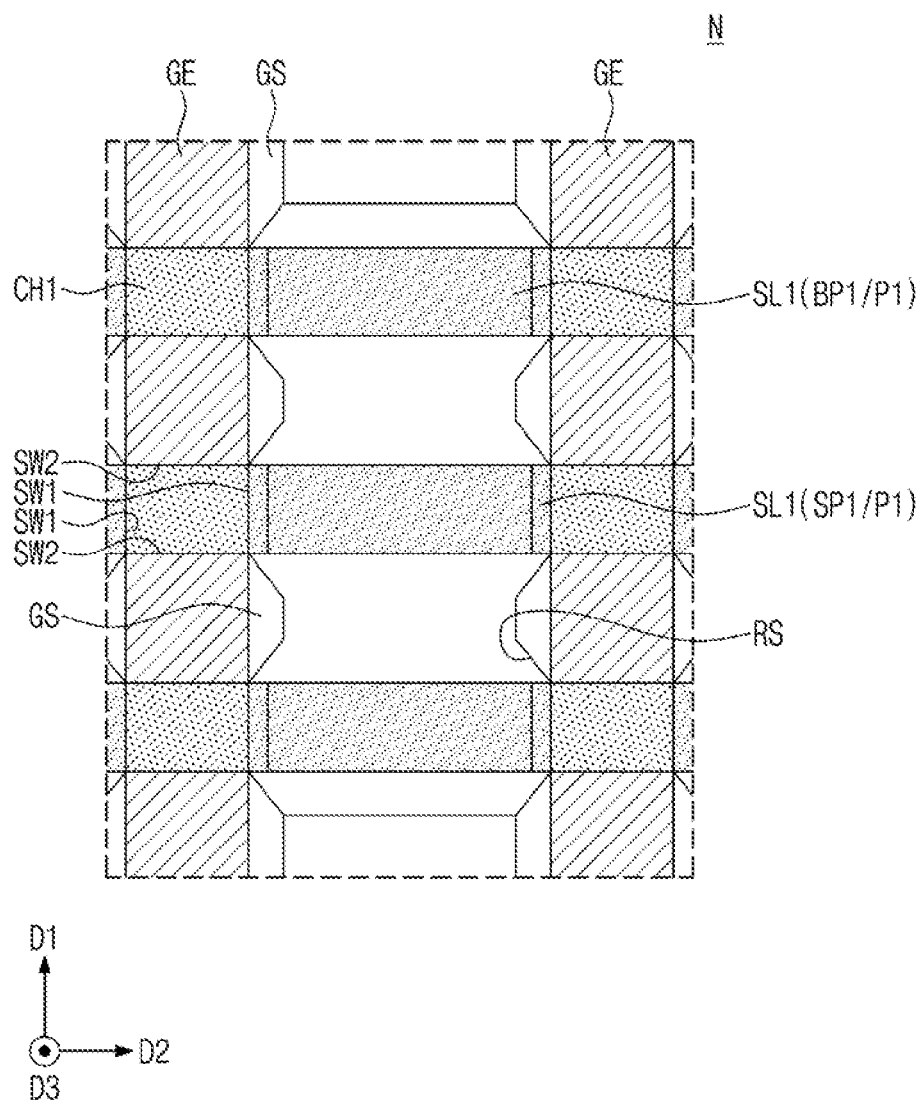
FIG. 9 illustrates an enlarged plan view of a first semiconductor layer in the region 'N'.

FIG. 8 is an enlarged plan view illustrating the region 'N' of FIG. 1, according to another embodiment. FIG. 9 is an enlarged plan view illustrating a first semiconductor layer in the region 'N'. For concise description, a previously described element may be identified by the same reference number without repeating an overlapping description thereof.

Referring to FIGS. 8 and 9, the first semiconductor layer SL1 according to the present embodiments may include the first portion P1, and may not include the second portion P2 and the third portion P3. The first portion P1 of the first semiconductor layer SL1 may cover the first side surfaces SW1 of the first channel patterns CH1. In an implementation, the first semiconductor layer SL1 may not be provided on the second side surfaces SW2 of the first channel patterns CH1, and the second side surfaces SW2 of each of the first channel patterns CH1 may be in contact with the gate dielectric pattern GI. In an implementation, the first semiconductor layer SL1 may include the second and third portions P2 and P3 but may not include the first portion P1.

In an implementation, the first semiconductor layer SL1 having a relatively high germanium concentration may be between the first channel patterns CH1 and the second semiconductor layer SL2. It may be possible to prevent the impurities (e.g., boron) in the first source/drain pattern SD1 from being diffused into the first channel patterns CH1 and thereby to improve an operation property of the semiconductor device.

Figure 14A:
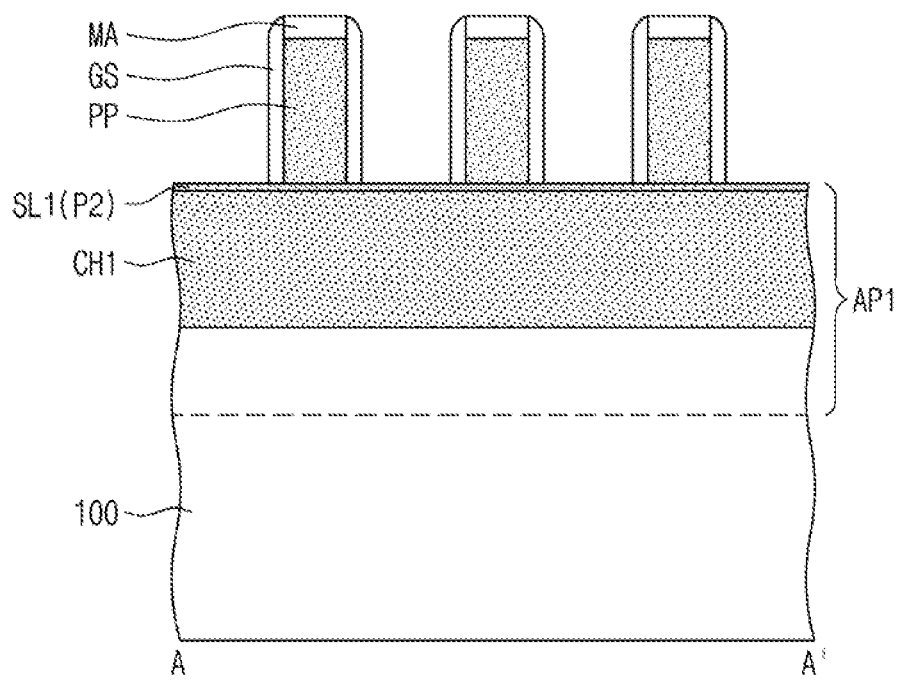
Figure 14B:
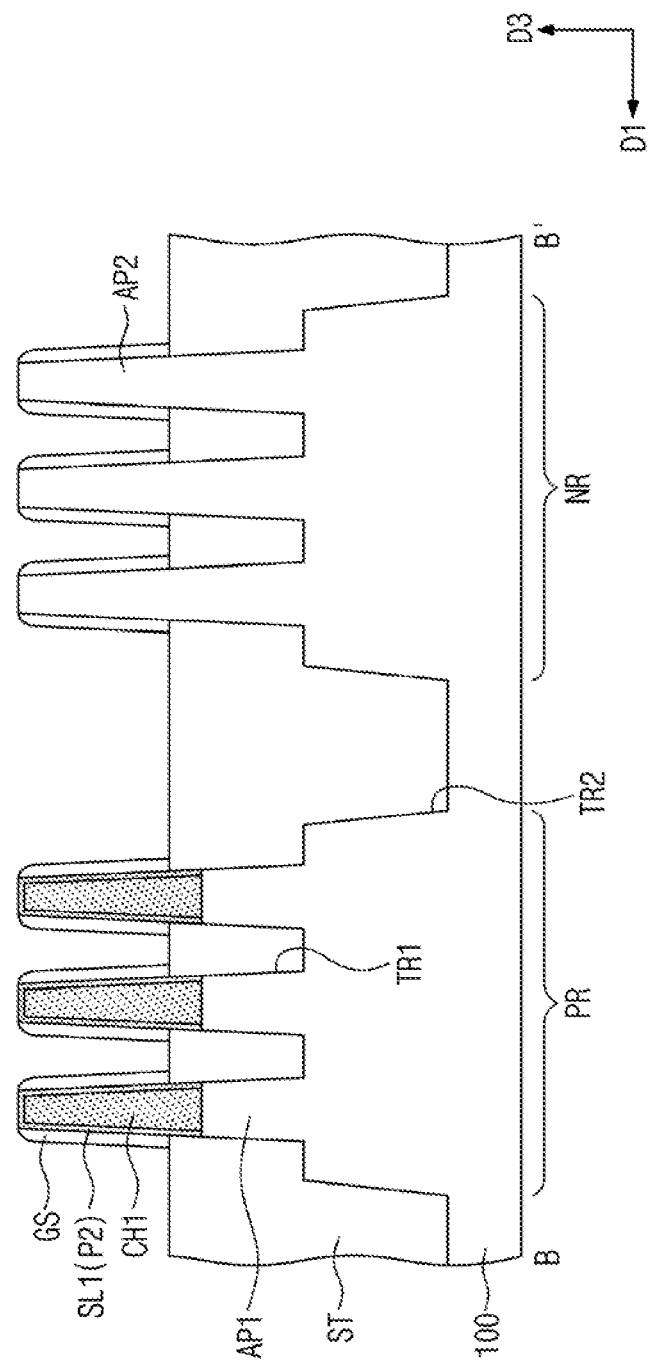
Figure 14C:
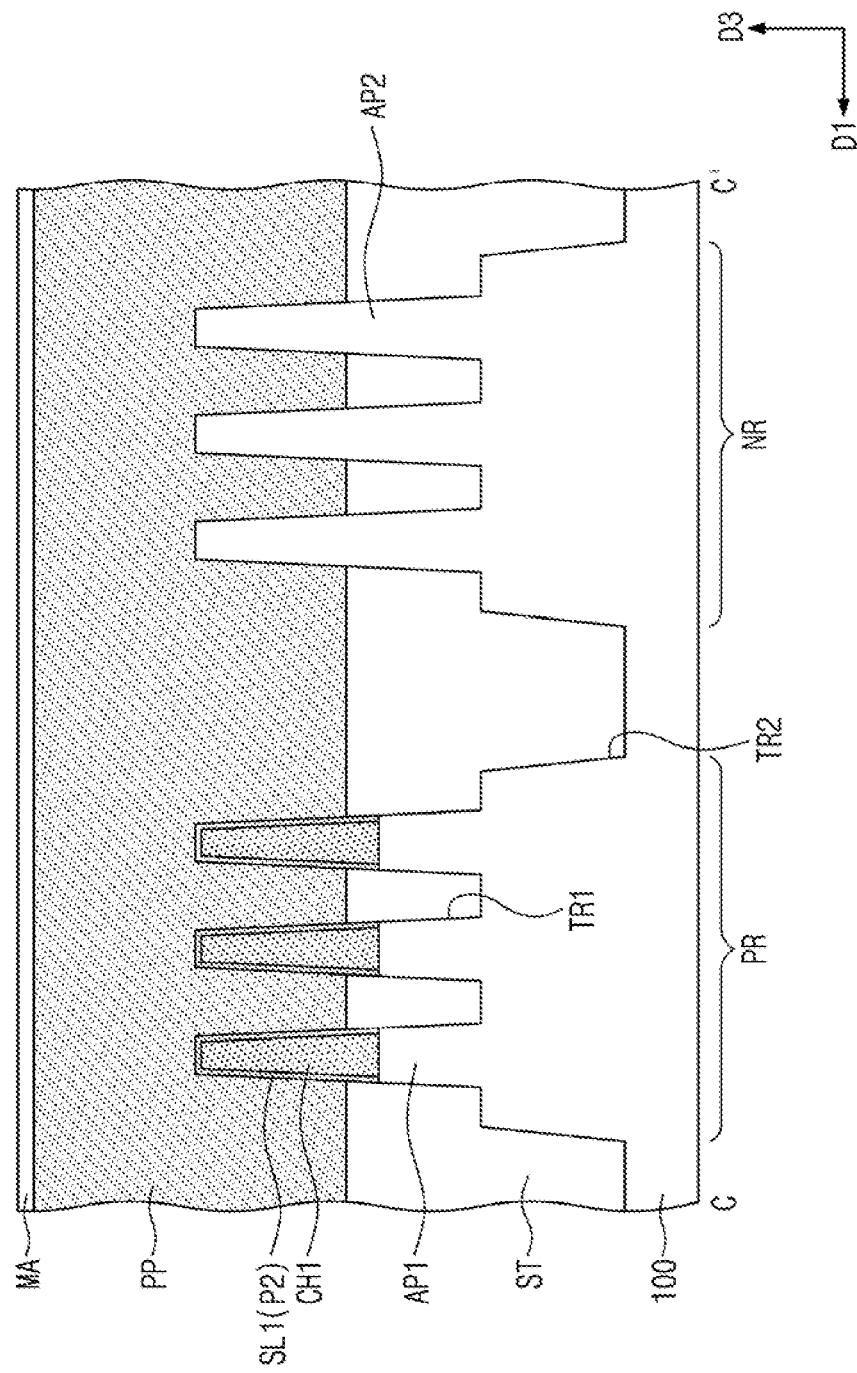
FIGS. 14C, 16C, and 24C illustrate sectional views taken along lines C-C' of FIGS. 13, 15, and 23, respectively.
Figure 15:
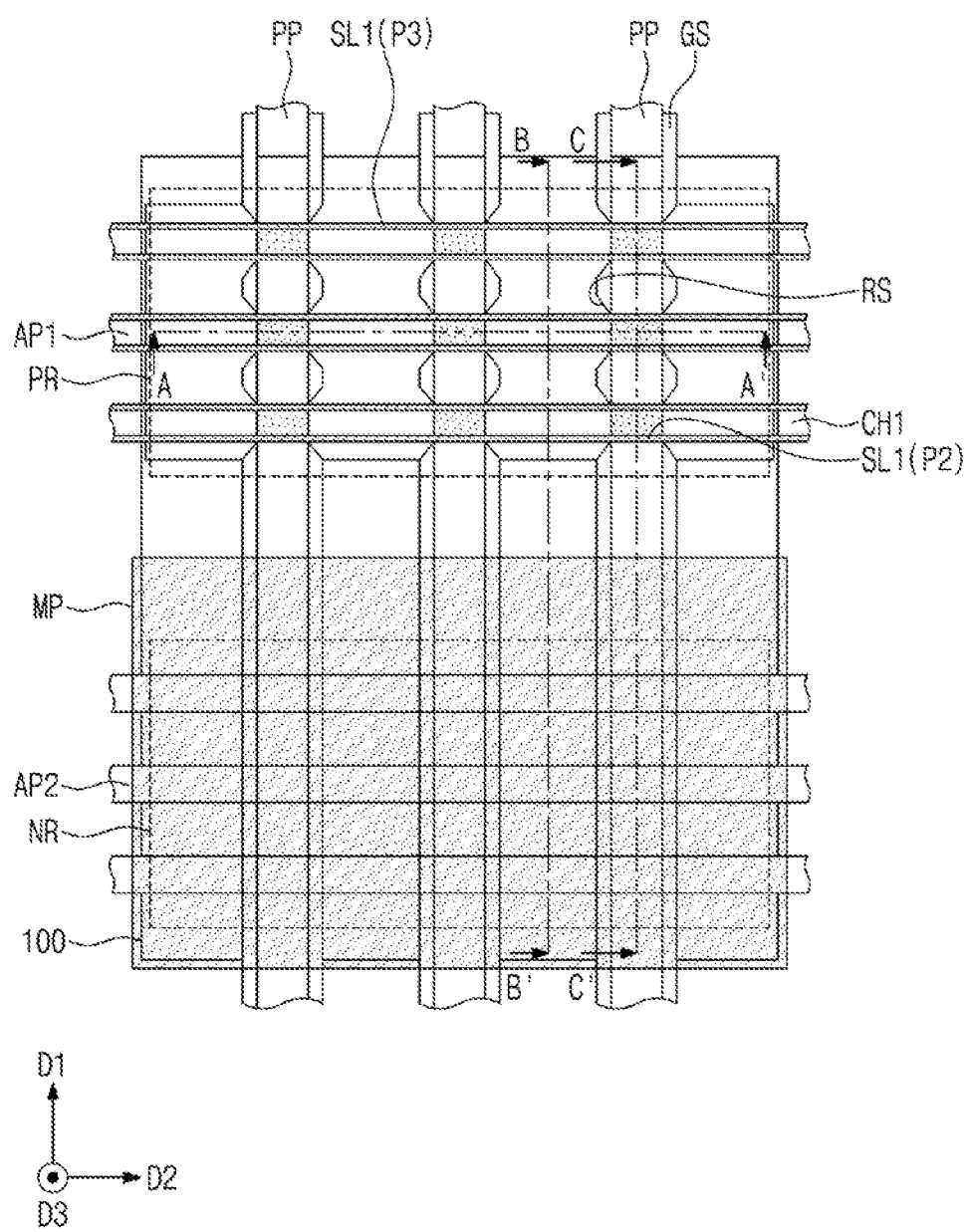
Figure 16A:
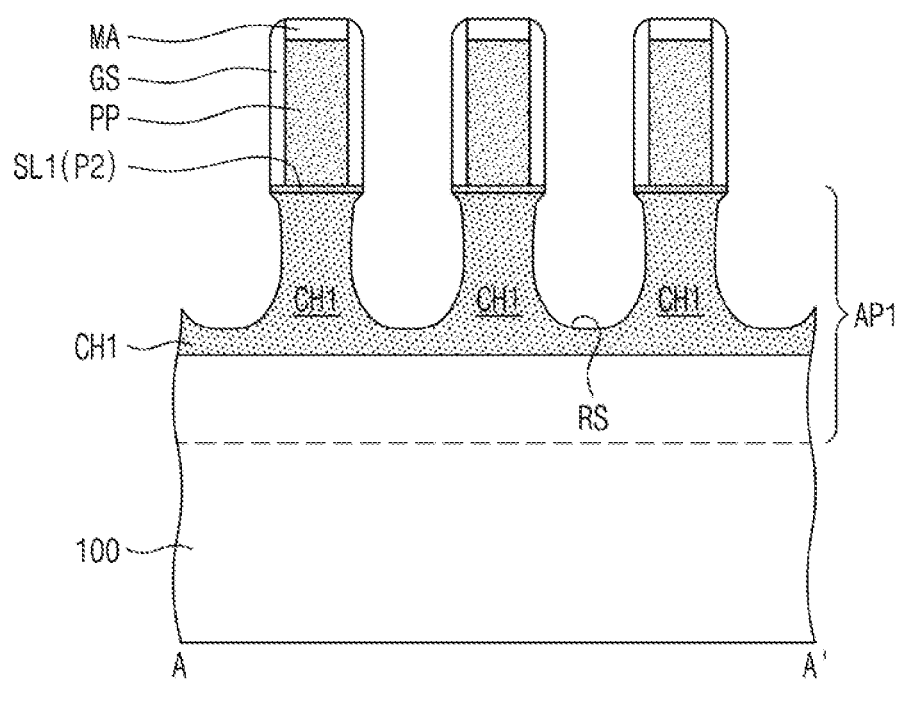
Figure 16B:
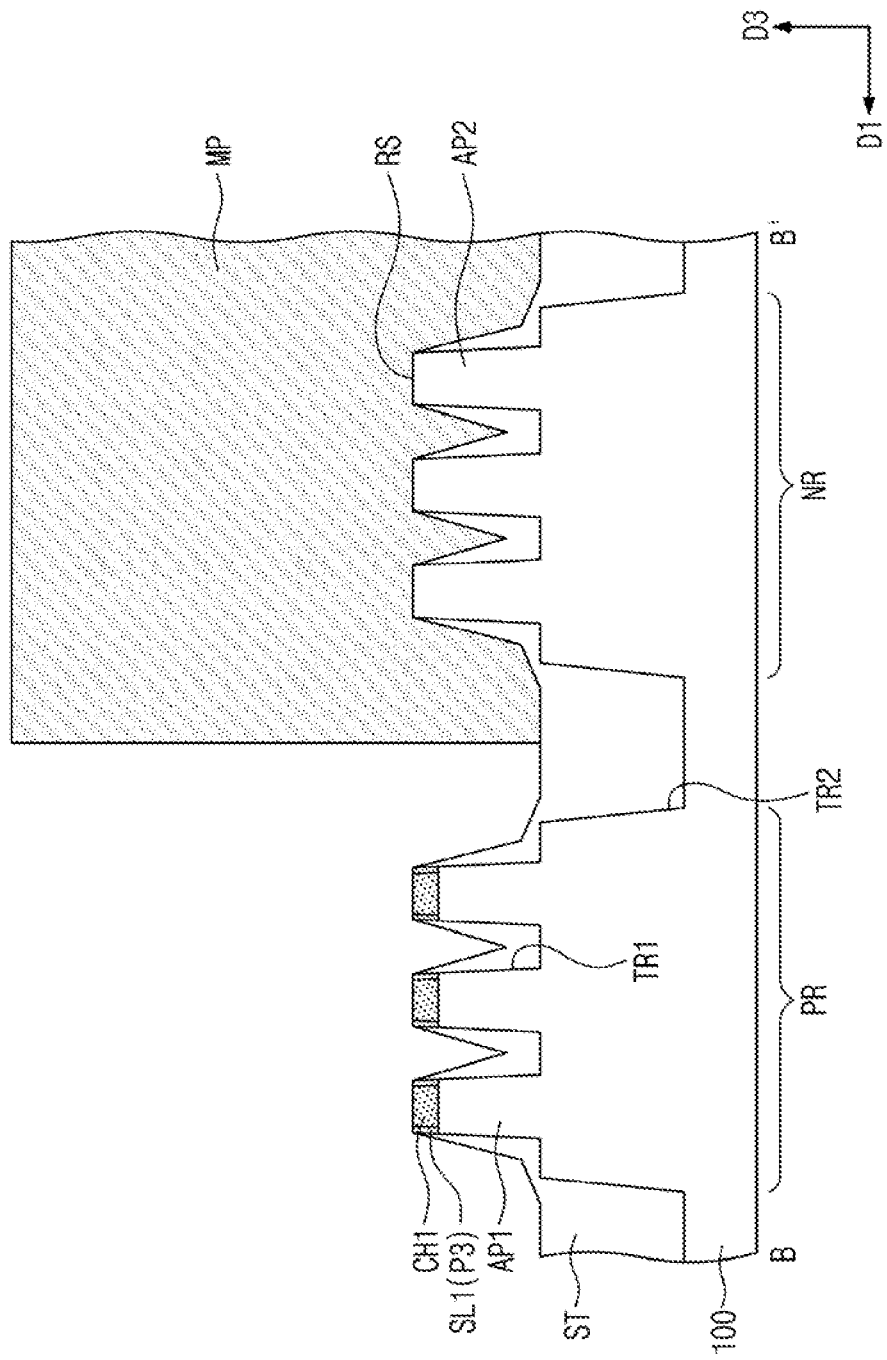
Figure 16C:
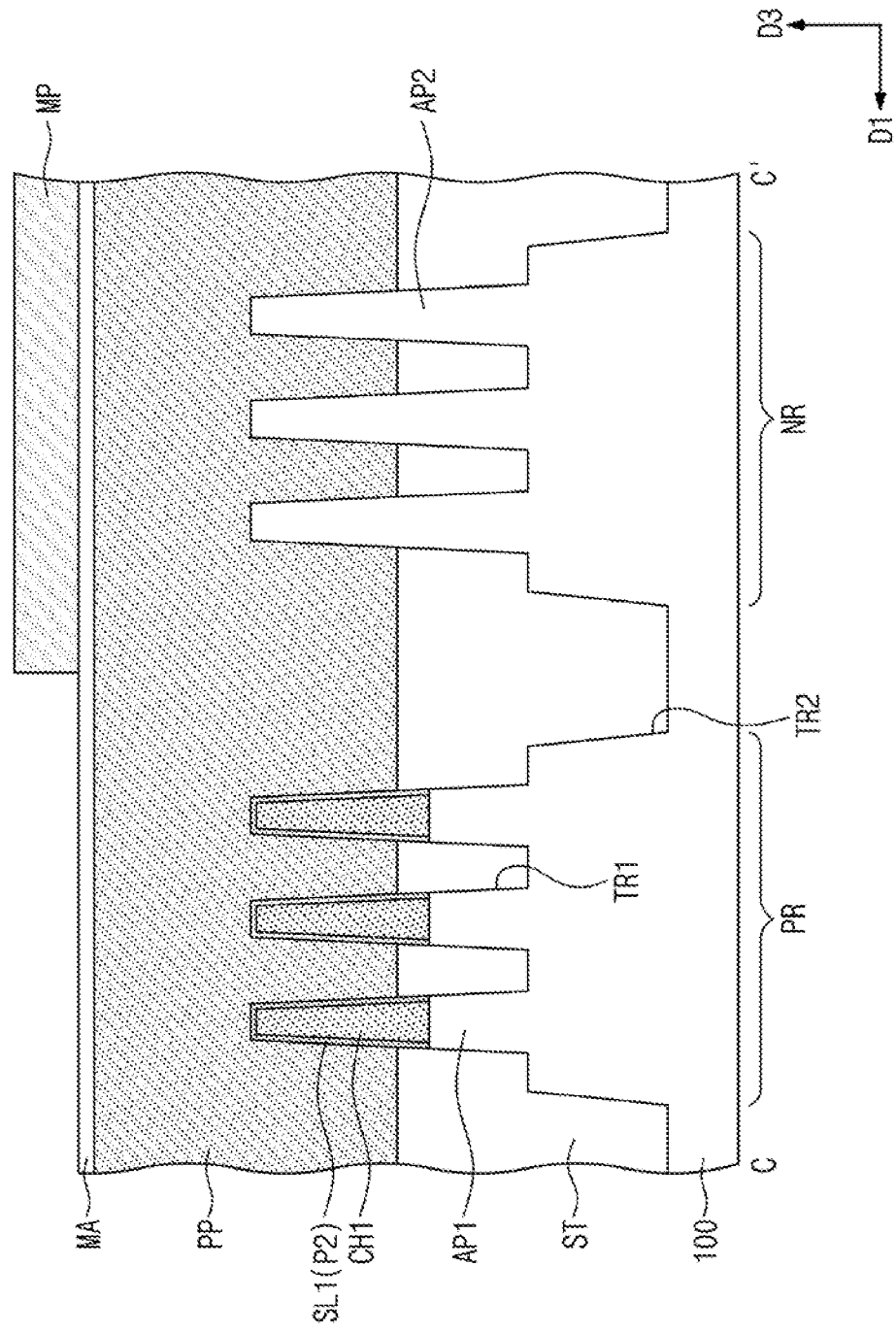
Figure 24A:
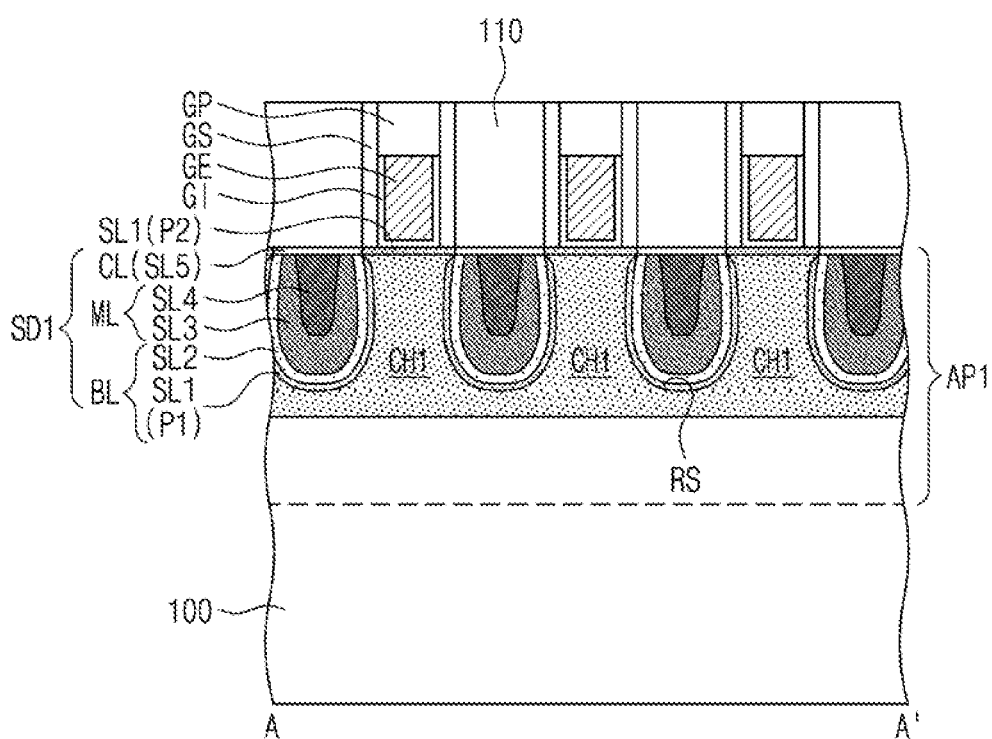
Figure 24B:
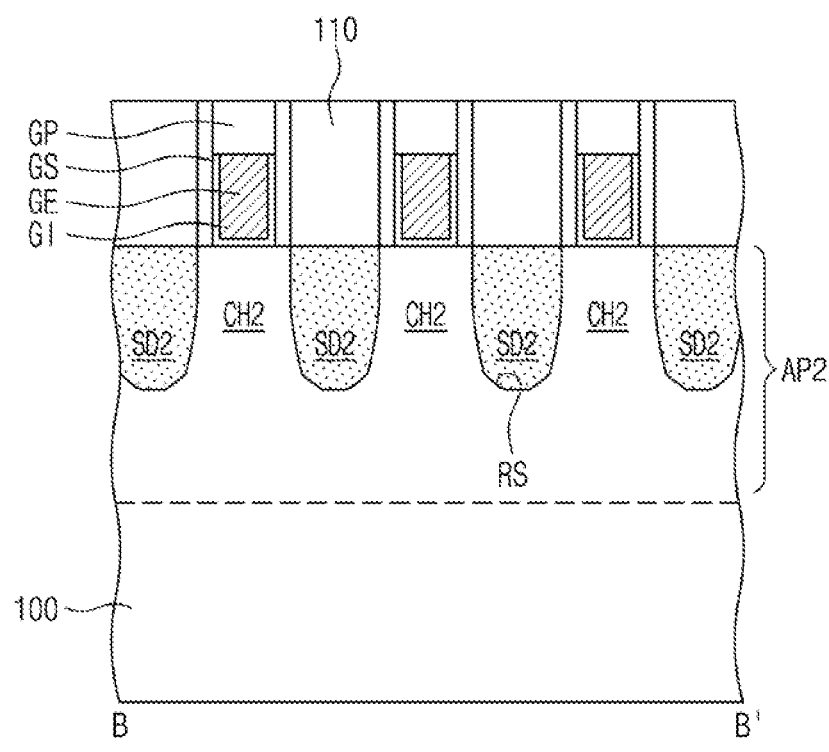
Figure 24C:
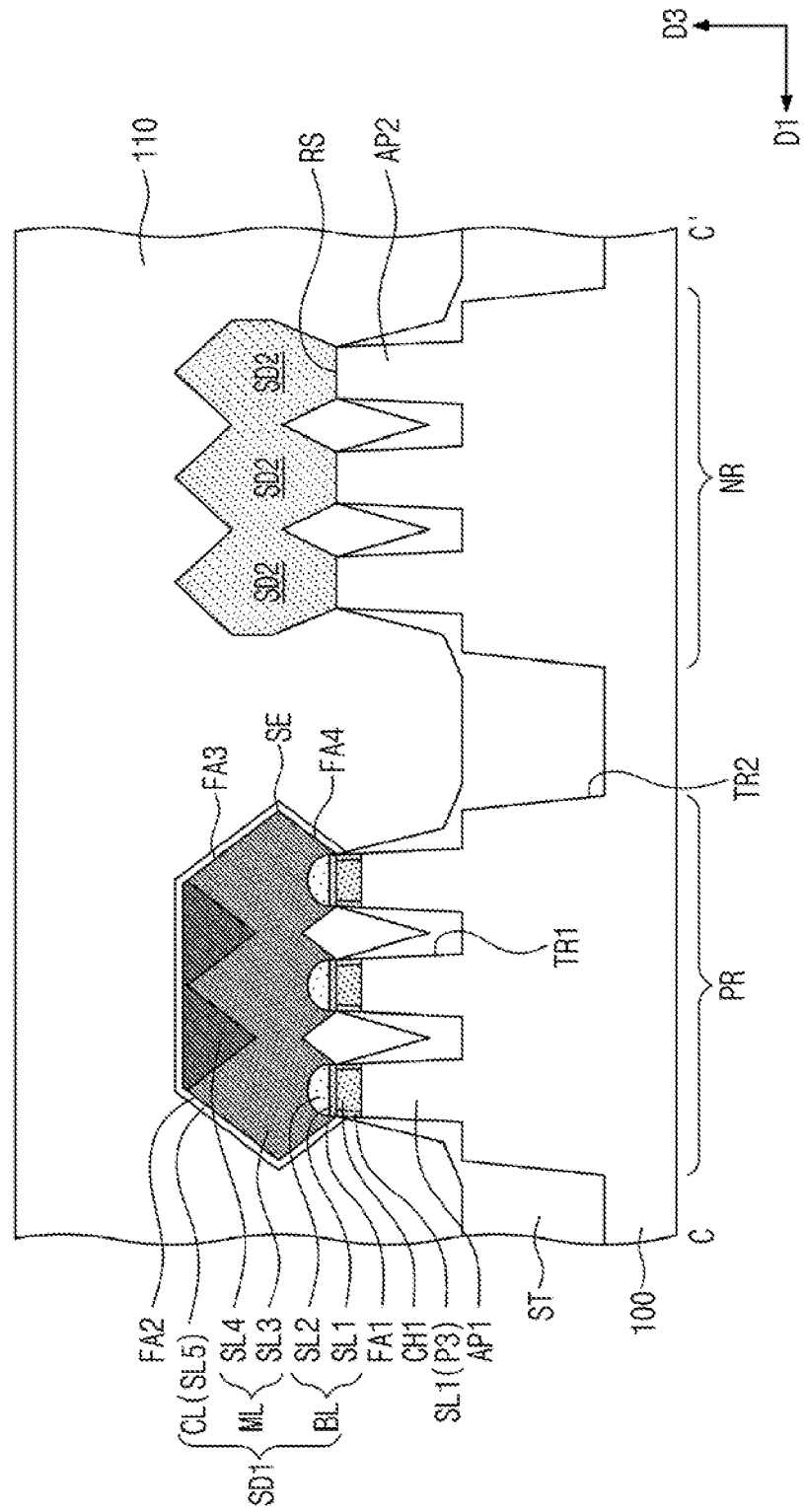
Figure 24D:
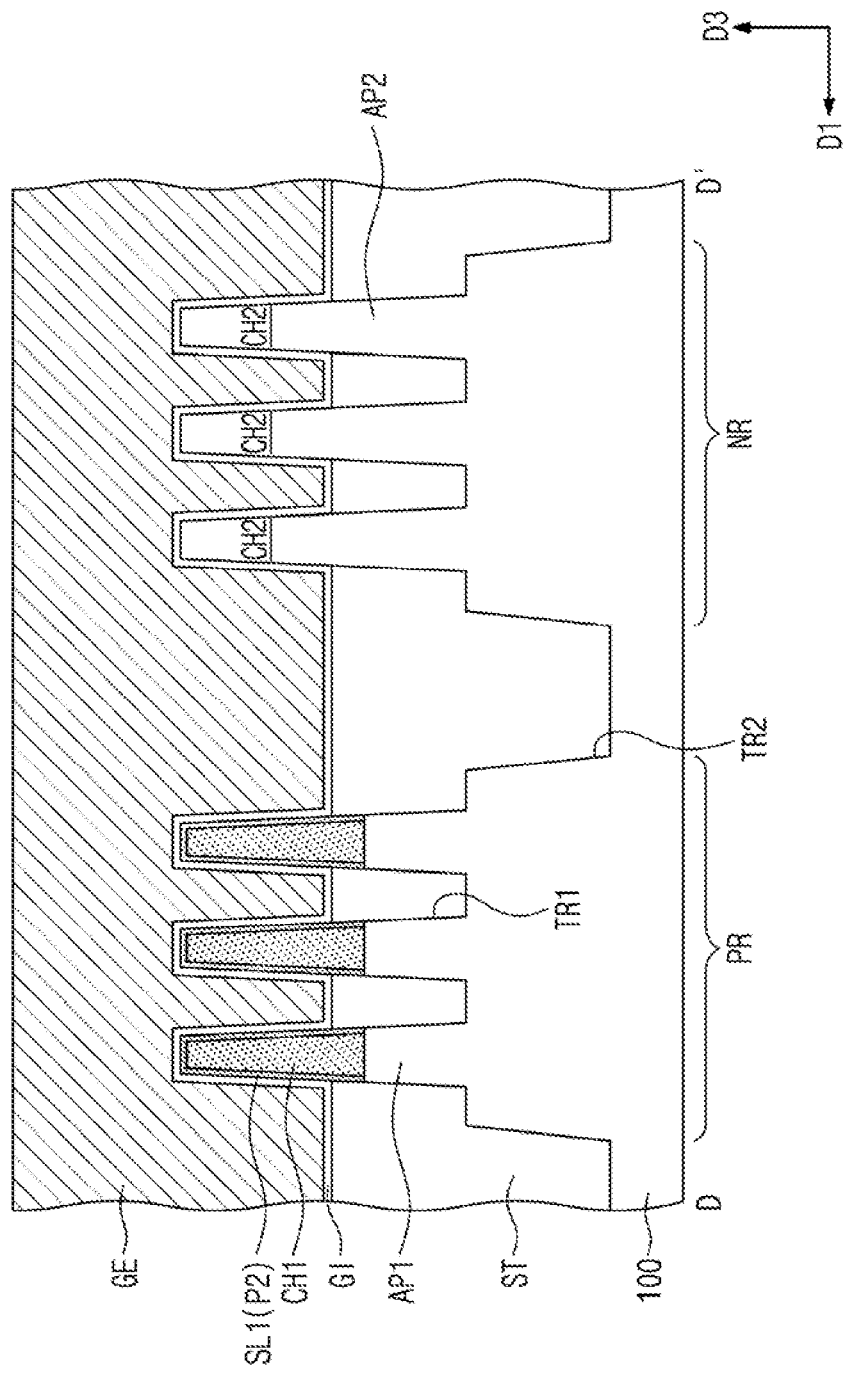
FIG. 24D illustrates a sectional view taken along a line D-D' of FIG. 23.

FIGS. 10, 13, 15, 17, 19, 21, and 23 are plan views illustrating stages in a method of fabricating a semiconductor device, according to an embodiment. FIGS. 11, 12, 14A, 16A, 18A, 20A, 22A, and 24A are sectional views taken along lines A-A' of FIGS. 10, 13, 15, 17, 19, 21, and 23, respectively. FIGS. 14B, 16B, 18B, 20B, 22B, and 24B are sectional views taken along lines B-B' of FIGS. 13, 15, 17, 19, 21, and 23, respectively. FIGS. 14C, 16C, and 24C are sectional views taken along lines C-C' of FIGS. 13, 15, and 23, respectively. FIG. 24D is a sectional view taken along a line D-D' of FIG. 23.

Figure 10:
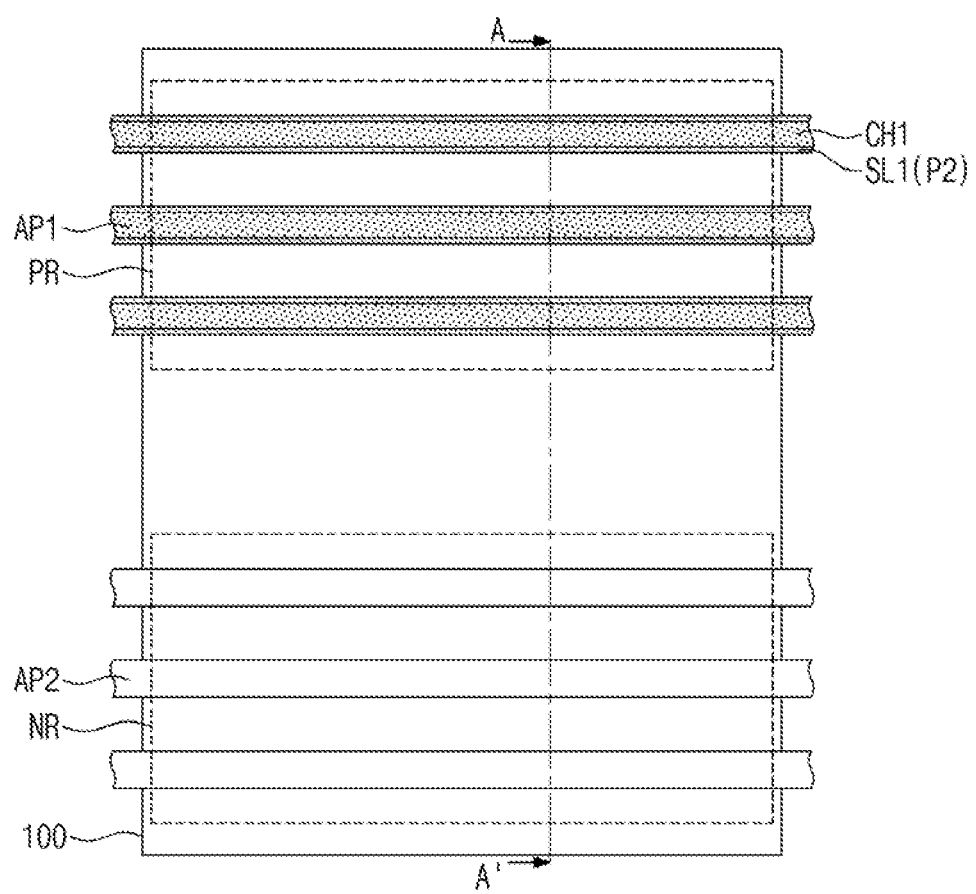
FIGS. 10, 13, 15, 17, 19, 21, and 23 illustrate plan views of stages in a method of fabricating a semiconductor device, according to an embodiment.
Figure 10:
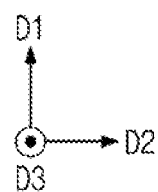
Figure 11:
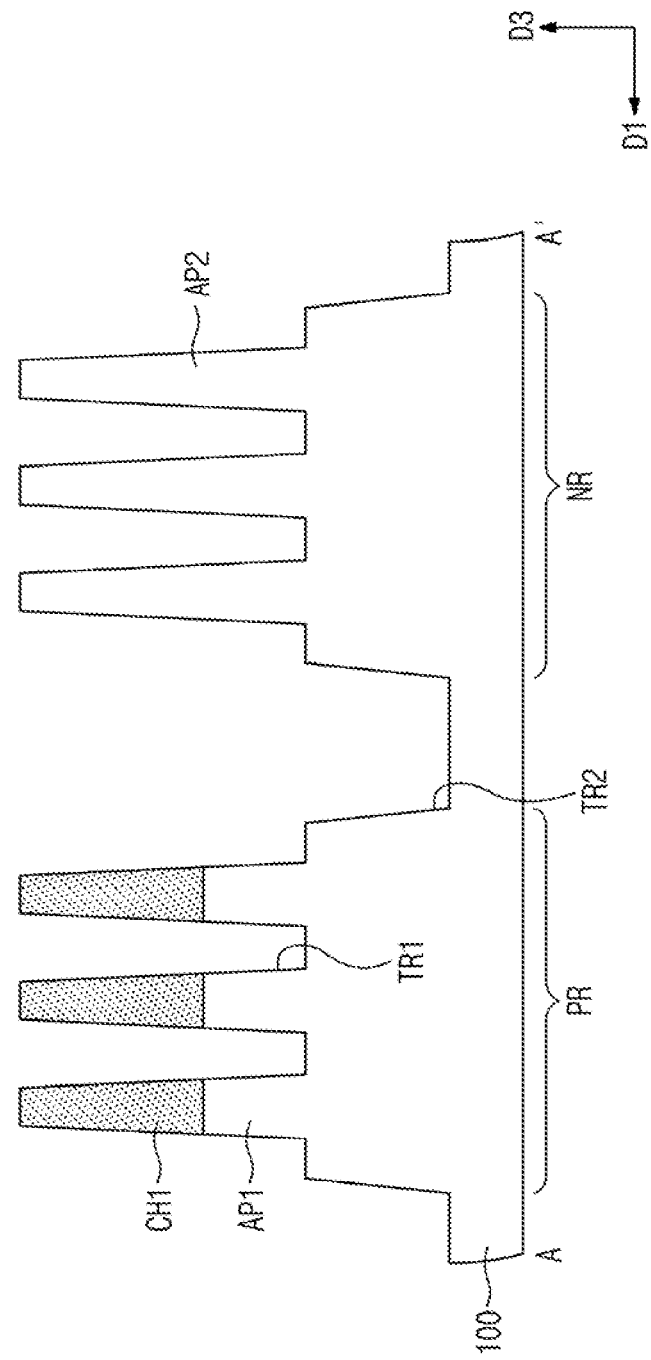
FIGS. 11, 12, 14A, 16A, 18A, 20A, 22A, and 24A illustrate sectional views taken along lines A-A' of FIGS. 10, 13, 15, 17, 19, 21, and 23, respectively.

Referring to FIGS. 10 and 11, the substrate 100 including the first and second active regions PR and NR may be provided. A base layer may be provided on the first active region PR, and here, the base layer may be formed of or include a semiconductor material different from the substrate 100. In an implementation, the base layer may be a silicon-germanium layer. In an implementation, the base layer may be formed to fill a recess region, which may be formed by etching the first active region PR in the first active region PR of the substrate 100.

The substrate 100 and the base layer may be patterned to form the first and second active patterns AP1 and AP2. The first active patterns AP1 may be formed on the first active region PR, and the second active patterns AP2 may be formed on the second active region NR. The base layer may be patterned to form the first channel patterns CH1. The first trench TR1 may be formed between the first active patterns AP1 and between the second active patterns AP2.

The substrate 100 may be patterned to form the second trench TR2 between the first and second active regions PR and NR. The second trench TR2 may be formed to be deeper than the first trench TR1.

Figure 12:
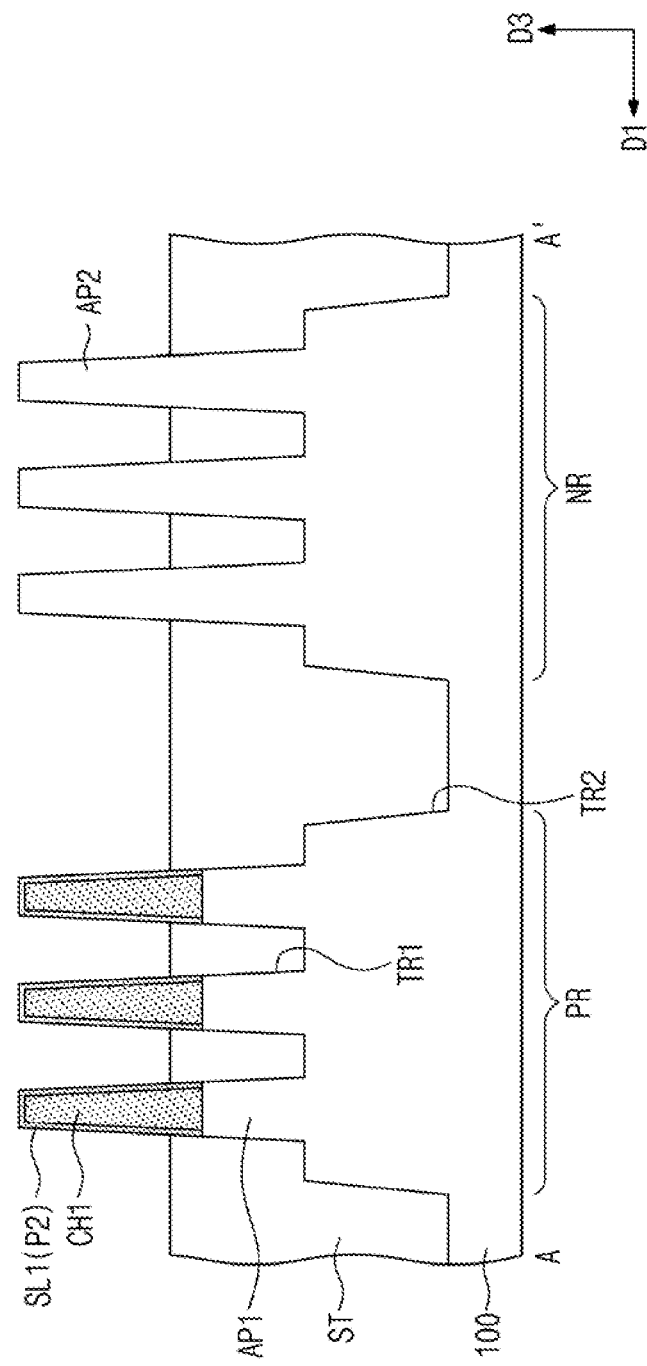
Figure 13:
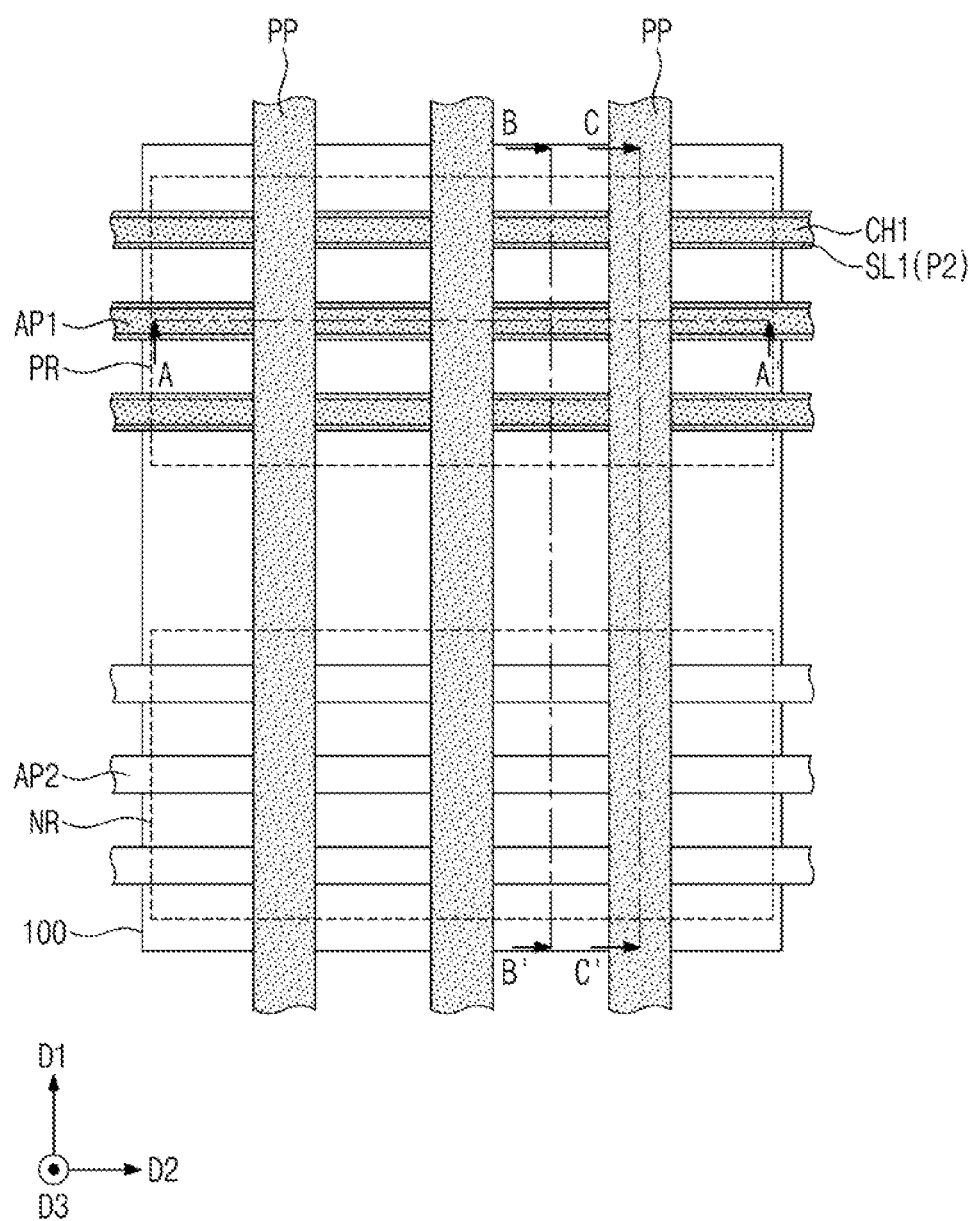

Referring to FIGS. 10 and 12, the device isolation layer ST may be formed on the substrate 100 to fill the first and second trenches TR1 and TR2. The device isolation layer ST may be formed of or include an insulating material (e.g., silicon oxide). In an implementation, the device isolation layer ST may include a liner insulating layer, which is conformally formed along the first and second trenches TR1 and TR2. The device isolation layer ST may be recessed to expose upper portions of the first and second active patterns AP1 and AP2. The upper portions of the first and second active patterns AP1 and AP2 may protrude above the device isolation layer ST in a vertical direction (e.g., the third direction D3).

The formation of the device isolation layer ST may include performing an annealing process at least one time. The annealing process may be performed at a temperature from about 700° C. to about 900° C. As a result of the annealing process, the first semiconductor layer SL1 (e.g., the second portion P2) may be formed on the surfaces of the first channel patterns CH1. The second portion P2 may have a germanium concentration from about 30 at % to about 50 at %. The second portion P2 may be formed by a germanium migration phenomenon, in which germanium atoms migrate toward surfaces of the first channel patterns CH1 at high temperature. The germanium migration phenomenon may be caused by a difference in diffusion speed between germanium and silicon, at high temperature. The third portion of the first semiconductor layer SL1 may also be produced in this step.

In embodiments described with reference to FIGS. 8 and 9, the formation of the second and third portions P2 and P3 may be omitted. In an implementation, the annealing process may be omitted, or the temperature or process time of the annealing process may be adjusted such that the second and third portions P2 and P3 are not formed. Hereinafter, the embodiments of FIGS. 1 and 2A to 2D will be described.

Referring to FIGS. 13 and 14A to 14C, sacrificial patterns PP may be formed to cross the first and second active patterns AP1 and AP2. The sacrificial patterns PP may be formed to have a line or bar shape extending in the first direction D1. In an implementation, the formation of the sacrificial patterns PP may include forming a sacrificial layer on the substrate 100, forming hard mask patterns MA on the sacrificial layer, and patterning the sacrificial layer using the hard mask patterns MA as an etch mask. The sacrificial layer may include a poly-silicon layer.

A pair of the gate spacers GS may be formed on both side surfaces of each of the sacrificial patterns PP. The gate spacers GS may also be formed on both side surfaces of each of the first and second active patterns AP1 and AP2. The both side surfaces of each of the first and second active patterns AP1 and AP2 may be portions that are not covered with the device isolation layer ST and the sacrificial patterns PP and are exposed.

The formation of the gate spacers GS may include conformally forming a gate spacer layer on the substrate 100 and anisotropically etching the gate spacer layer. The gate spacer layer may be formed of or include SiCN, SiCON, or SiN. In an implementation, the gate spacer layer may be a multi-layered structure including at least two of SiCN, SiCON, or SiN.

Referring to FIGS. 15 and 16A to 16C, recesses RS may be formed in the upper portion of each of the first and second active patterns AP1 and AP2. A pair of the recesses RS may be formed at both sides of each of the sacrificial patterns PP. The formation of the recesses RS may include etching the upper portions of the first and second active patterns AP1 and AP2 using the hard mask patterns MA and the gate spacers GS as an etch mask. During the etching process, the gate spacers GS may be removed from both side surfaces of each of the first and second active patterns AP1 and AP2. The gate spacers GS may be partially left on the side surfaces of the recesses RS. The exposed portion of the device isolation layer ST may be recessed during the etching process.

A first mask layer MP may be formed to selectively cover the second active patterns AP2. The first mask layer MP may selectively cover the second active region NR and may expose the first active region PR. The first mask layer MP may expose the first active patterns AP1.

Figure 17:
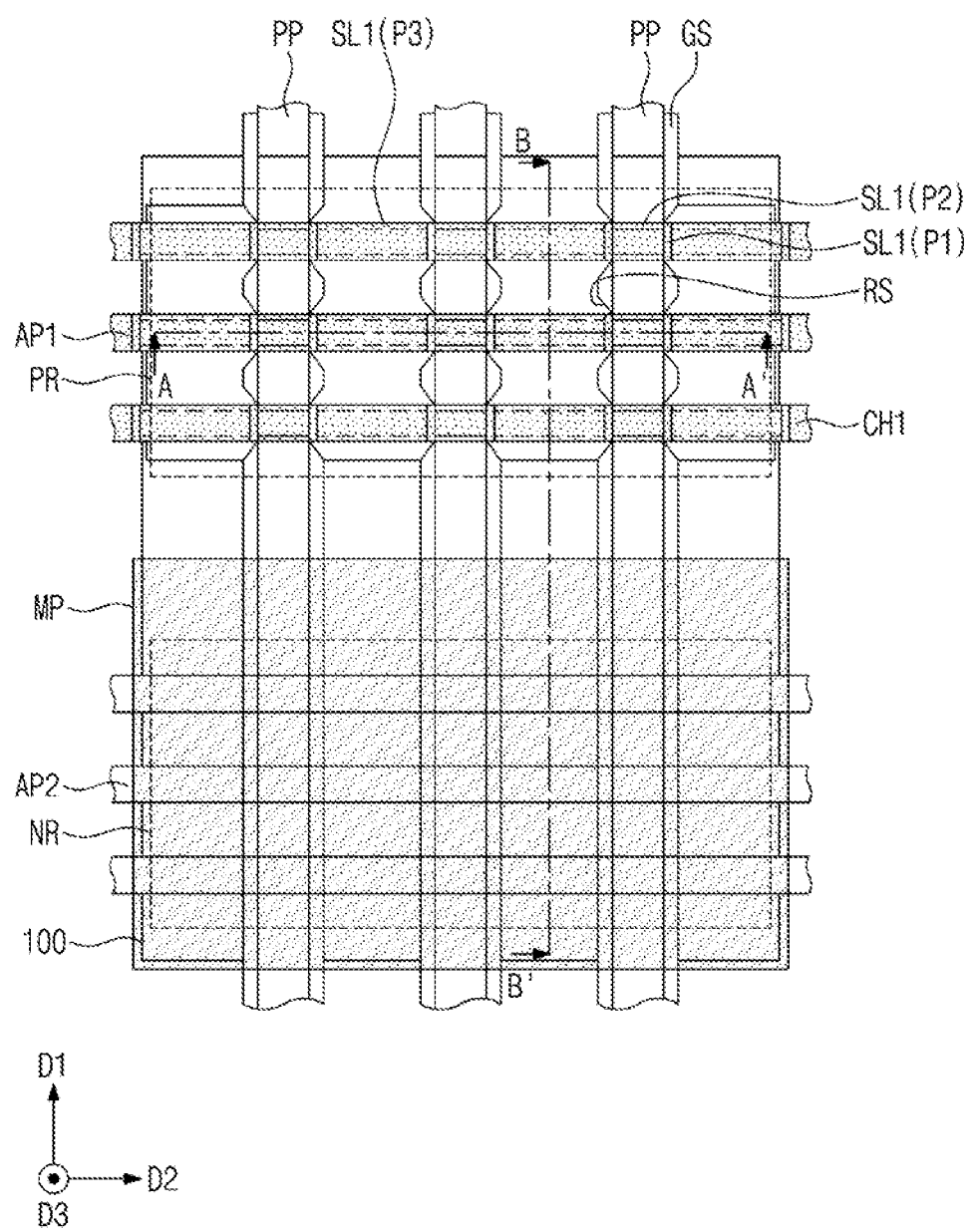
Figure 18A:
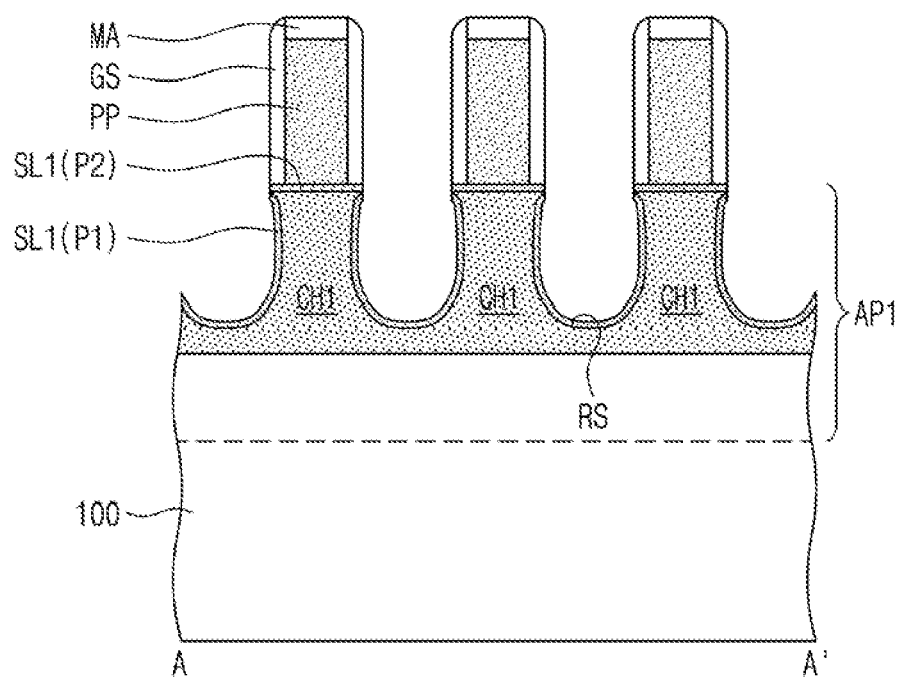
Figure 18A:
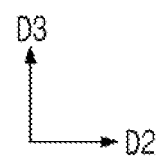

Referring to FIGS. 17 and 18A to 18B, the first semiconductor layer SL1 (e.g., the first portions P1) may be formed in the recesses RS. The first portions P1 may be doped to contain a low concentration of impurities. In an implementation, the first portions P1 may be formed of or include boron-doped silicon-germanium. The first portions P1 may be formed by a hydrogen ($H_2$) bake process, which may be performed for a pre-cleaning process on the surfaces of the recesses RS. In an implementation, the bake process may be performed at a temperature from about 700° C. to about 900° C. The first portions P1 may be formed by a germanium migration phenomenon, in which germanium atoms migrate toward surfaces of the first channel patterns CH1 at high temperature. In an implementation, the first portions P1 may be formed to a thickness from about 1 nm to about 5 nm. A germanium concentration of the first portions P1 may range from about 30 at % to about 50 at %. The first portions P1 may be connected to the second portions P2 and the third portions P3. In an implementation, the bake process may be omitted, and the first portions P1 may not be provided.

Figure 19:
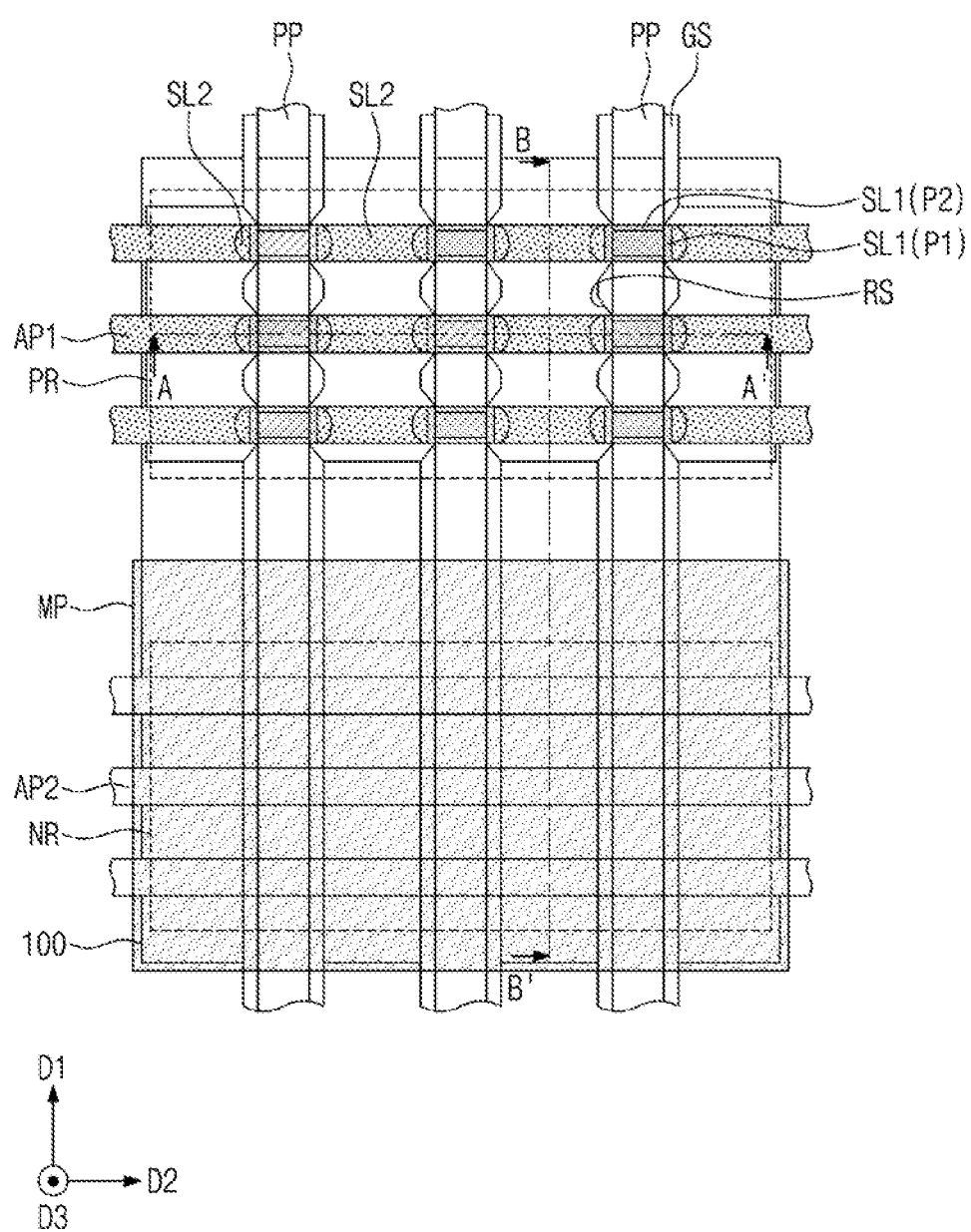
Figure 20A:
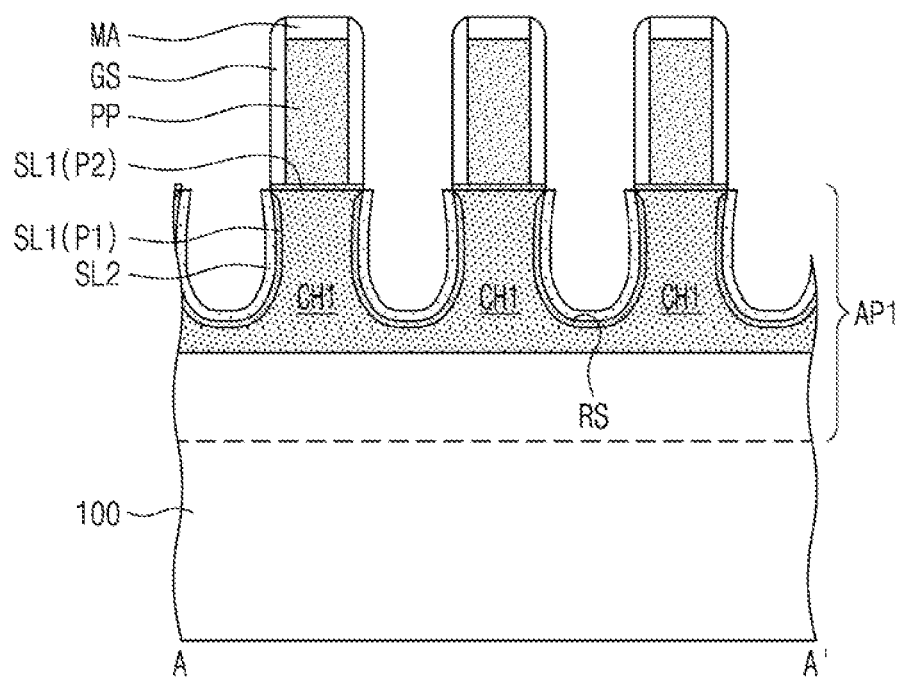
Figure 20B:
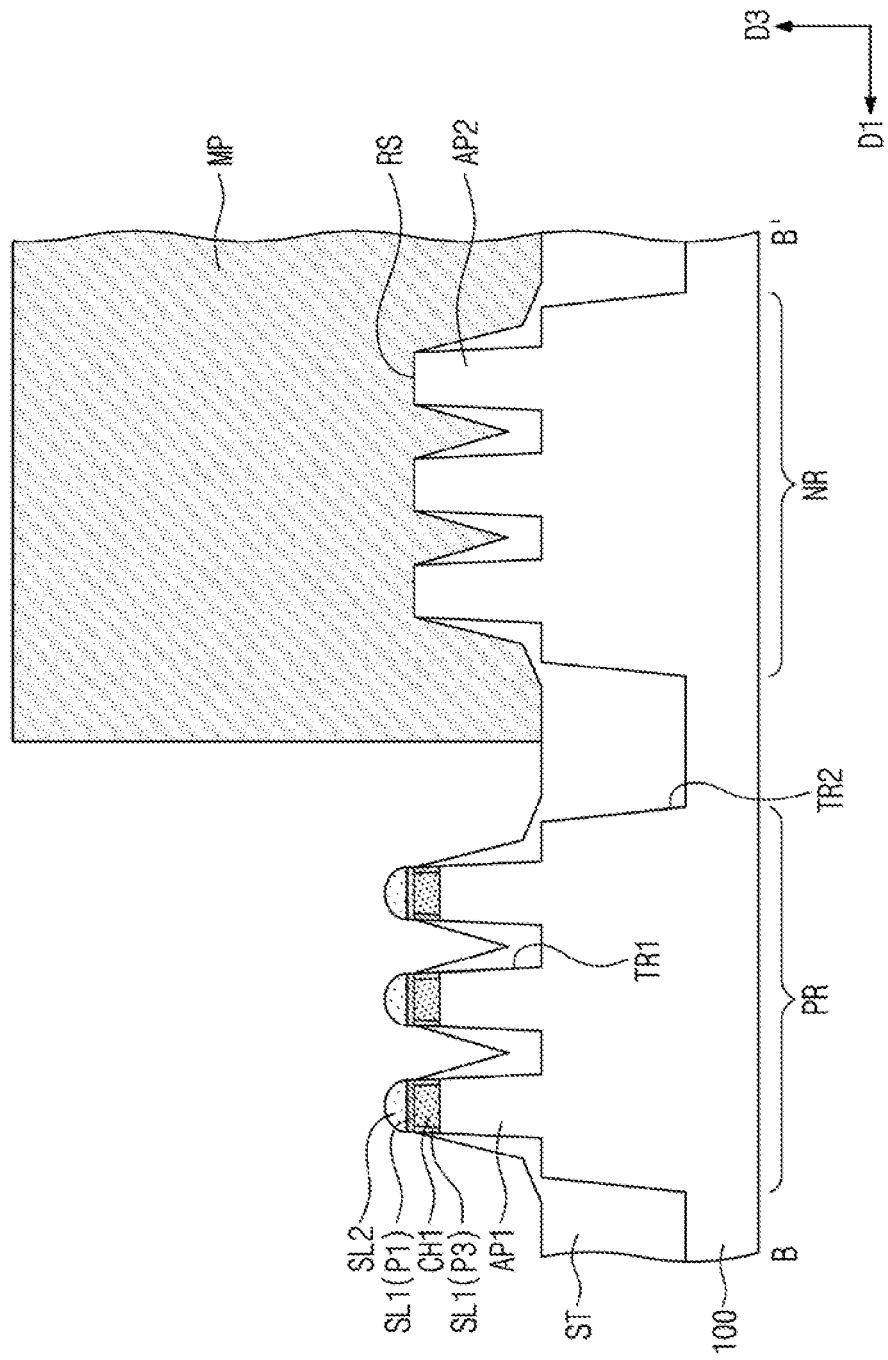

Referring to FIGS. 19 and 20A to 20B, the second semiconductor layers SL2 may be formed in the recesses RS to cover the first portions P1 (of the first semiconductor layers SL1). The second semiconductor layers SL2 may be doped to have a low concentration of impurities. In an implementation, the second semiconductor layers SL2 may be formed of or include boron-doped silicon-germanium.

The formation of the second semiconductor layers SL2 may include performing a first SEG process using the first portions P1 as a seed layer. In an implementation, the first SEG process may include a chemical vapor deposition (CVD) process or a molecular beam epitaxy (MBE) process. In an implementation, the second semiconductor layers SL2 may have a convex sectional shape, as shown in FIG. 20B. The second semiconductor layers SL2 may be formed to have a substantially conformal profile. The germanium concentration of the second semiconductor layer SL2 may range from about 20 at % to about 30 at %. The second semiconductor layer SL2 may be formed to a thickness from about 3 nm to about 9 nm.

Figure 21:
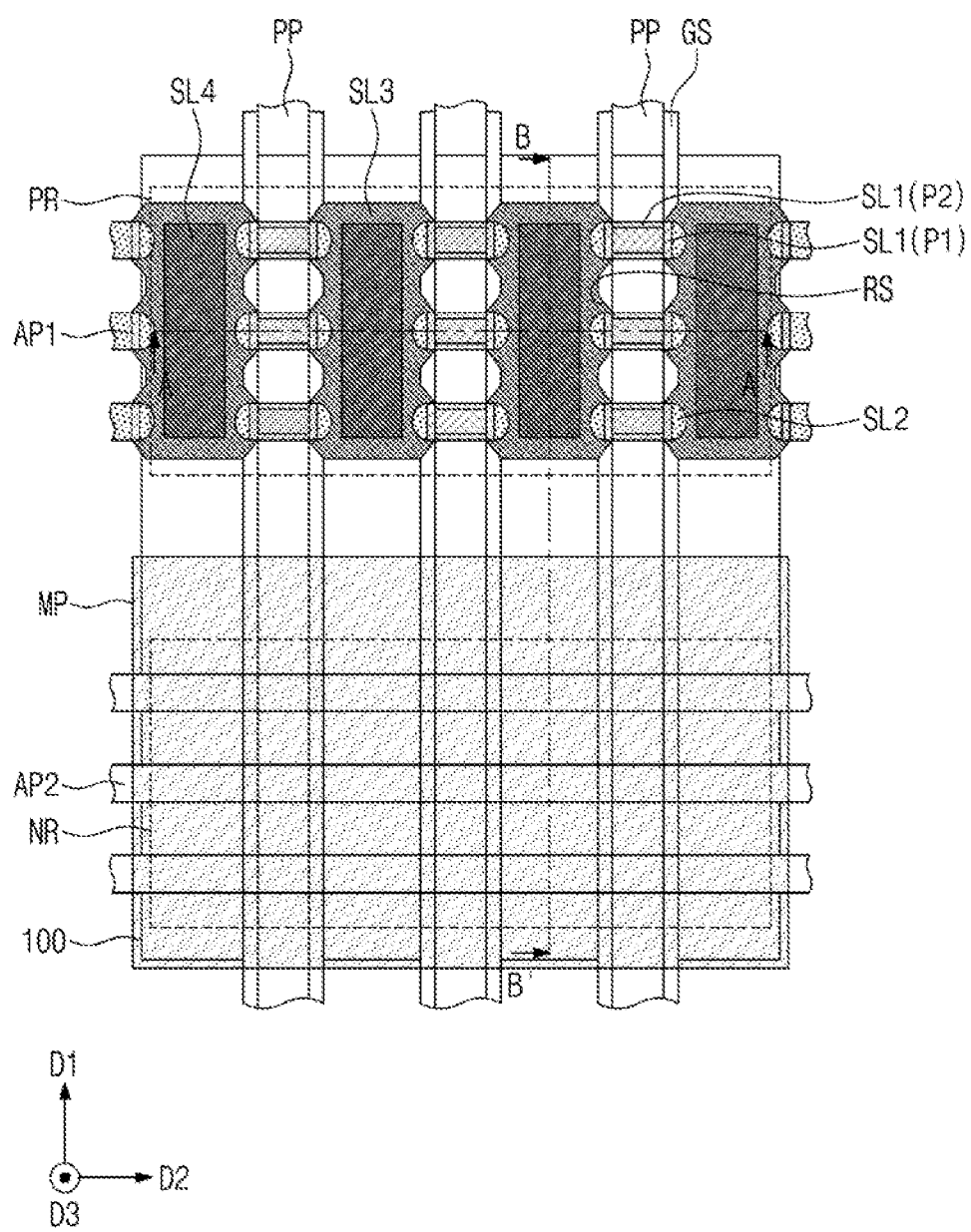
Figure 22A:
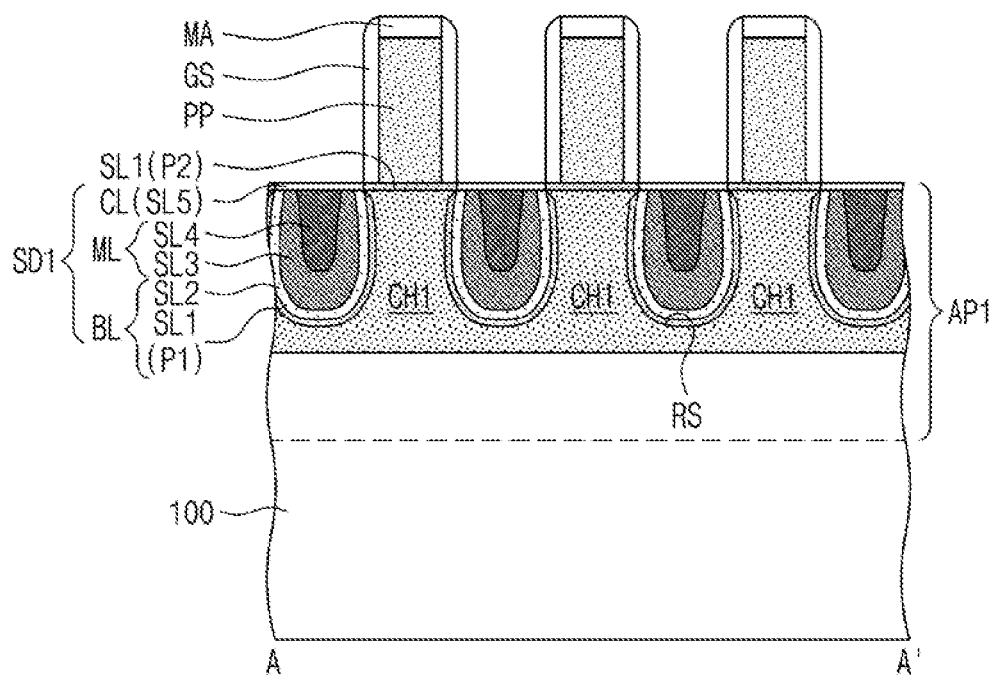
Figure 22A:
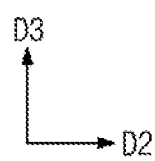
Figure 22B:
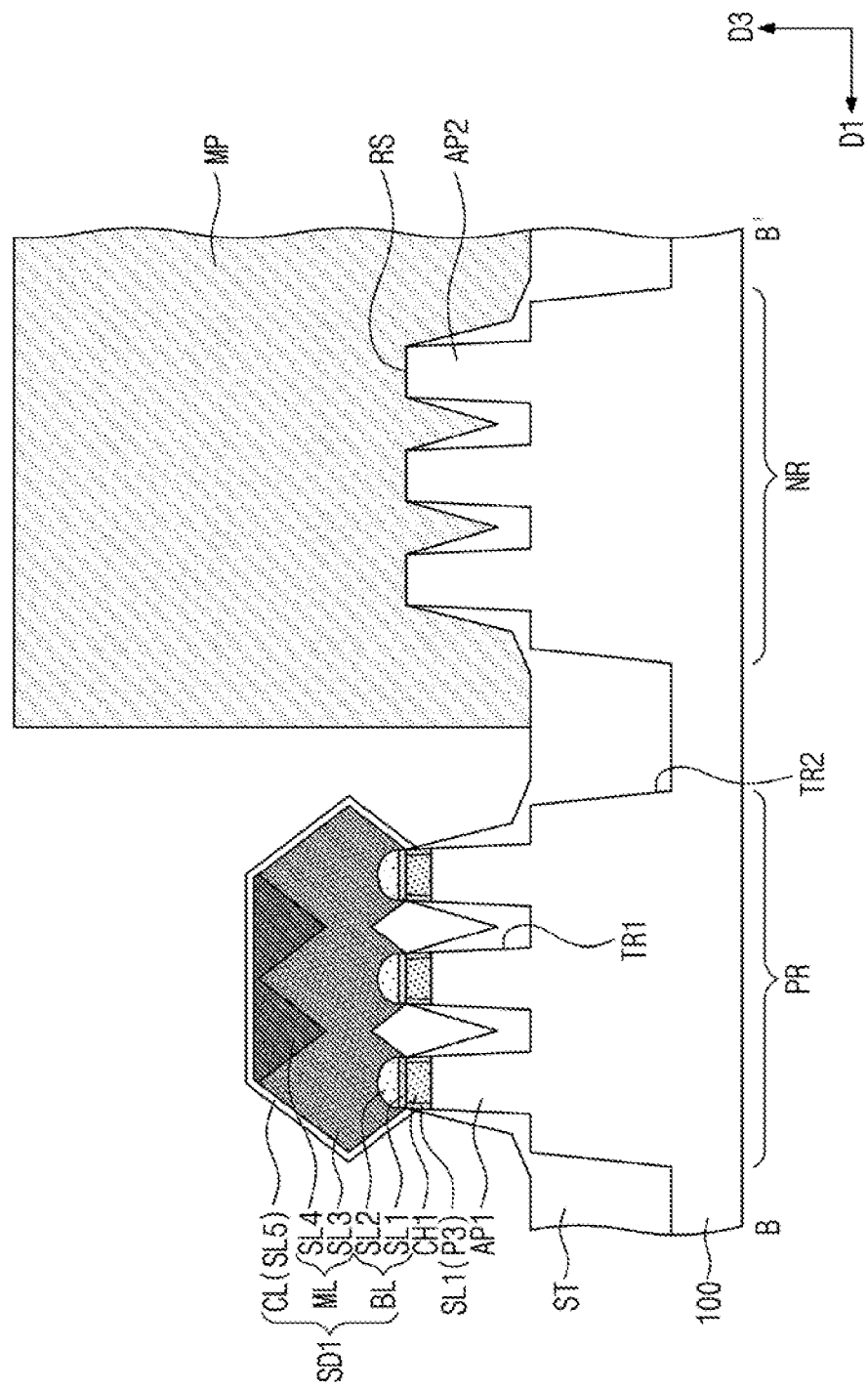
Figure 23:
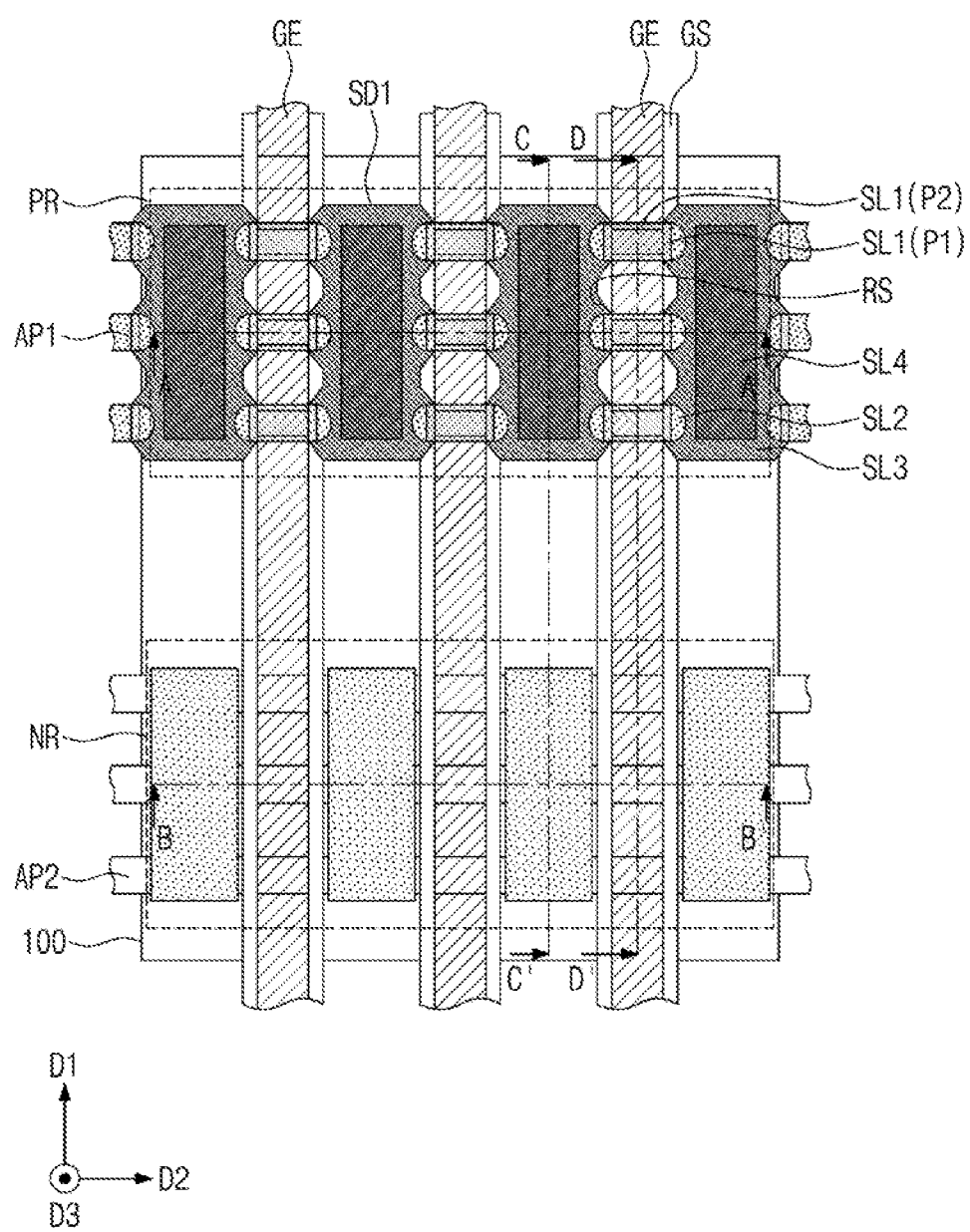

Referring to FIGS. 21, 22A, and 22B, the main layer ML and the capping layer CL may be formed on the second semiconductor layer SL2. The main layer ML may be doped to have an impurity concentration higher than the impurity concentration of the buffer layer BL. In an implementation, the main layer ML may be formed of or include a silicon-germanium (SiGe) layer, which is doped with boron (B). In an implementation, the third semiconductor layer SL3, the fourth semiconductor layer SL4, and the fifth semiconductor layer SL5 may be sequentially formed on the second semiconductor layer SL2.

The main layer ML may be formed by a second SEG process, in which the buffer layer BL is used as a seed layer. The capping layer CL may be formed by a third SEG process, in which the main layer ML is used as a seed layer. In an implementation, the capping layer CL may include single-crystalline silicon (Si). A concentration of silicon (Si) in the capping layer CL may range from 95 at % to 100 at %. In an implementation, the third SEG process may be performed at a lower temperature than that for the first and second SEG processes. The germanium concentration of the third semiconductor layer SL3 may range from about 45 at % to about 60 at %. The germanium concentration of the fourth semiconductor layer SL4 may range from about 50 at % to about 70 at %.

Referring to FIGS. 23 and 24A to 24D, the first mask layer MP may be removed. A second mask layer may be formed to selectively cover the first active patterns AP1. The second mask layer may selectively cover the first active region PR and may expose the second active region NR. The second mask layer may expose the second active patterns AP2.

The second source/drain patterns SD2 may be formed to fill the recesses RS of the second active patterns AP2 exposed by the second mask layer. For example, the formation of the second source/drain patterns SD2 may include performing an SEG process using exposed inner side surfaces of the recesses RS as a seed layer. The second source/drain patterns SD2 may contain the same semiconductor element (e.g., silicon (Si)) as that in the substrate 100. Thereafter, the second mask layer may be removed.

The first interlayered insulating layer 110 may be formed to cover the first and second source/drain patterns SD1 and SD2, the gate spacers GS, and the hard mask patterns MA. The first interlayered insulating layer 110 may be formed of or include silicon oxide.

A planarization process may be performed on the first interlayered insulating layer 110 to expose the top surfaces of the sacrificial patterns PP. The planarization of the first interlayered insulating layer 110 may be performed using an etch-back process or a chemical mechanical polishing (CMP) process. Thus, the first interlayered insulating layer 110 may have a top surface that is coplanar with the top surfaces of the sacrificial patterns PP and the top surfaces of the gate spacers GS.

Each of the sacrificial patterns PP may be replaced with the gate electrode GE and the gate dielectric pattern GI. In an implementation, the sacrificial patterns PP exposed may be selectively removed to form an empty space. The gate dielectric pattern GI may be formed in the empty space, which is formed by removing the sacrificial pattern PP. The gate electrode GE may be formed on the gate dielectric pattern GI to fill the empty space.

The gate dielectric pattern GI may be conformally formed by an atomic layer deposition (ALD) and/or a chemical oxidation process. In an implementation, the gate dielectric pattern GI may be formed of or include a high-k dielectric material. In an implementation, the gate dielectric pattern GI may be formed of or include a ferroelectric material.

The formation of the gate electrode GE may include forming a gate electrode layer on the gate dielectric pattern GI and planarizing the gate electrode layer. In an implementation, the gate electrode layer may include a first gate electrode layer including metal nitride and a second gate electrode layer including low resistance metal.

An upper portion of the gate electrode GE may be selectively etched to recess the gate electrode GE. The recessed top surface of the gate electrode GE may be lower than the top surface of the first interlayered insulating layer 110 and the top surfaces of the gate spacers GS. The gate capping pattern GP may be formed on the recessed gate electrode GE. The formation of the gate capping pattern GP may include forming a gate capping layer to cover the recessed gate electrode GE and planarizing the gate capping layer to expose the top surface of the first interlayered insulating layer 110. In an implementation, the gate capping layer may be formed of or include SiON, SiCN, SiCON, or SiN.

Referring back to FIGS. 1 and 2A to 2D, the second interlayered insulating layer 120 may be formed on the first interlayered insulating layer 110. The active contacts AC may be formed to penetrate the second interlayered insulating layer 120 and the first interlayered insulating layer 110 and to be electrically connected to the first and second source/drain patterns SD1 and SD2. The gate contact GC may be formed to penetrate the second interlayered insulating layer 120 and the gate capping pattern GP and to be electrically connected to the gate electrode GE. The formation of the active contacts AC and the gate contact GC may include forming the barrier pattern BM to fill a contact hole and forming the conductive pattern FM on the barrier pattern BM.

The interface pattern SC may be formed between the active contact AC and the first source/drain pattern SD1 and between the active contact AC and the second source/drain pattern SD2. The formation of the interface pattern SC may include performing a silicidation process on the first and second source/drain patterns SD1 and SD2. In an implementation, the interface pattern SC may be formed of or include titanium silicide, tantalum silicide, tungsten silicide, nickel silicide, or cobalt silicide.

The third interlayered insulating layer 130 may be formed on the second interlayered insulating layer 120. The first interconnection layer may be formed in the third interlayered insulating layer 130. The formation of the first interconnection layer may include forming the interconnection lines IL and forming the vias VI under the interconnection lines IL. The interconnection lines IL and the vias VI may be formed by a damascene process or a dual damascene process.

FIGS. 25A to 25D are sectional views, which are taken along lines A-A', B-B', C-C', and D-D' of FIG. 1 to illustrate a semiconductor device according to an embodiment. In the following description, an element previously described with reference to FIGS. 1, 2A to 2D, and 3 may be identified by the same reference number without repeating an overlapping description thereof, for the sake of brevity.

Referring to FIGS. 1 and 25A to 25D, the substrate 100 including the first and second active regions PR and NR may be provided. The device isolation layer ST may be on the substrate 100. The device isolation layer ST may define the first active patterns AP1 and the second active patterns AP2 in an upper portion of the substrate 100. The first and second active patterns AP1 and AP2 may be defined on the first and second active regions PR and NR, respectively.

Each of the first active patterns AP1 may include the first channel patterns CH1 which are vertically stacked on the substrate 100. The stack of the first channel patterns CH1 may be spaced apart from each other in the third direction D3. The first channel patterns CH1 may be overlapped with each other, when viewed in a plan view.

Each of the second active patterns AP2 may include the second channel patterns CH2 which are vertically stacked on the substrate 100. The stack of the second channel patterns CH2 may be spaced apart from each other in the third direction D3. The second channel patterns CH2 may be overlapped with each other, when viewed in a plan view. The first channel patterns CH1 may be formed of or include a semiconductor material different from the substrate 100. For example, in the case where the substrate 100 is a silicon substrate, the first channel patterns CH1 may be formed of or include silicon-germanium. The second channel patterns CH2 may be formed of or include the same material (e.g., silicon (Si)) as the substrate 100.

The first source/drain patterns SD1 may penetrate at least a portion of the first channel patterns CH1. The recesses RS may penetrate at least a portion of the first channel patterns CH1, and the first source/drain patterns SD1 may fill the recesses RS, respectively. The stack of the first channel patterns CH1 may connect an adjacent pair of the first source/drain patterns SD1 to each other. The first source/drain patterns SD1 according to the present embodiment may be configured to have substantially the same features as those in the previous embodiments.

The second source/drain patterns SD2 may penetrate at least a portion of the second channel patterns CH2. The stack of the second channel patterns CH2 may connect an adjacent pair of the second source/drain patterns SD2 to each other. The second source/drain patterns SD2 according to the present embodiment may be configured to have substantially the same features as those in the previous embodiments.

The gate electrodes GE may cross the first and second channel patterns CH1 and CH2 and may extend in the first direction D1. The gate electrode GE may be overlapped with the first and second channel patterns CH1 and CH2, when viewed in a plan view. A pair of the gate spacers GS may be on both side surfaces of the gate electrode GE. The gate capping pattern GP may be provided on the gate electrode GE.

Figure 25A:
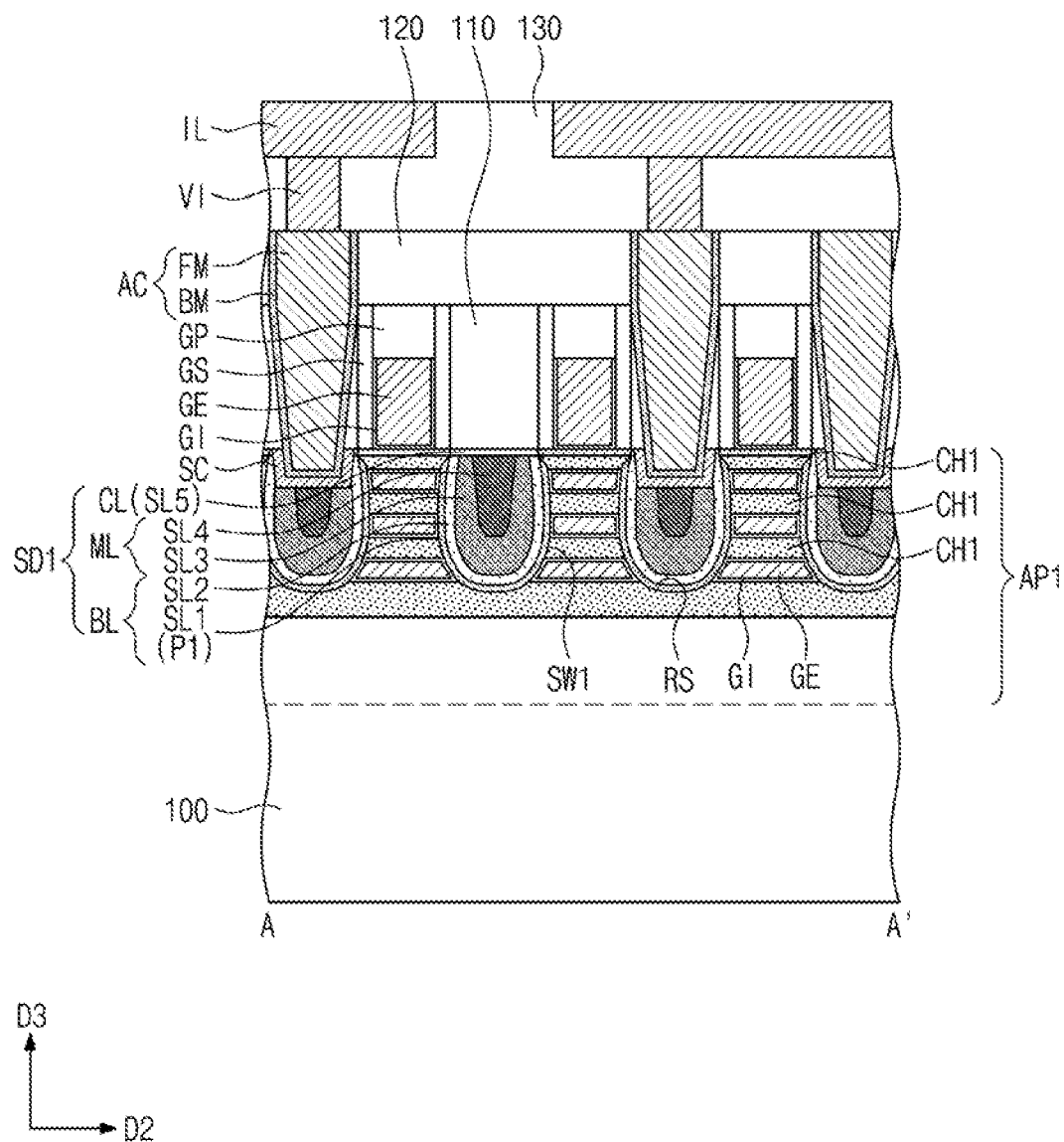
FIGS. 25A to 25D illustrate sectional views, which are taken along lines A-A', B-B', C-C', and D-D' of FIG. 1 to illustrate a semiconductor device according to an embodiment.
Figure 25B:
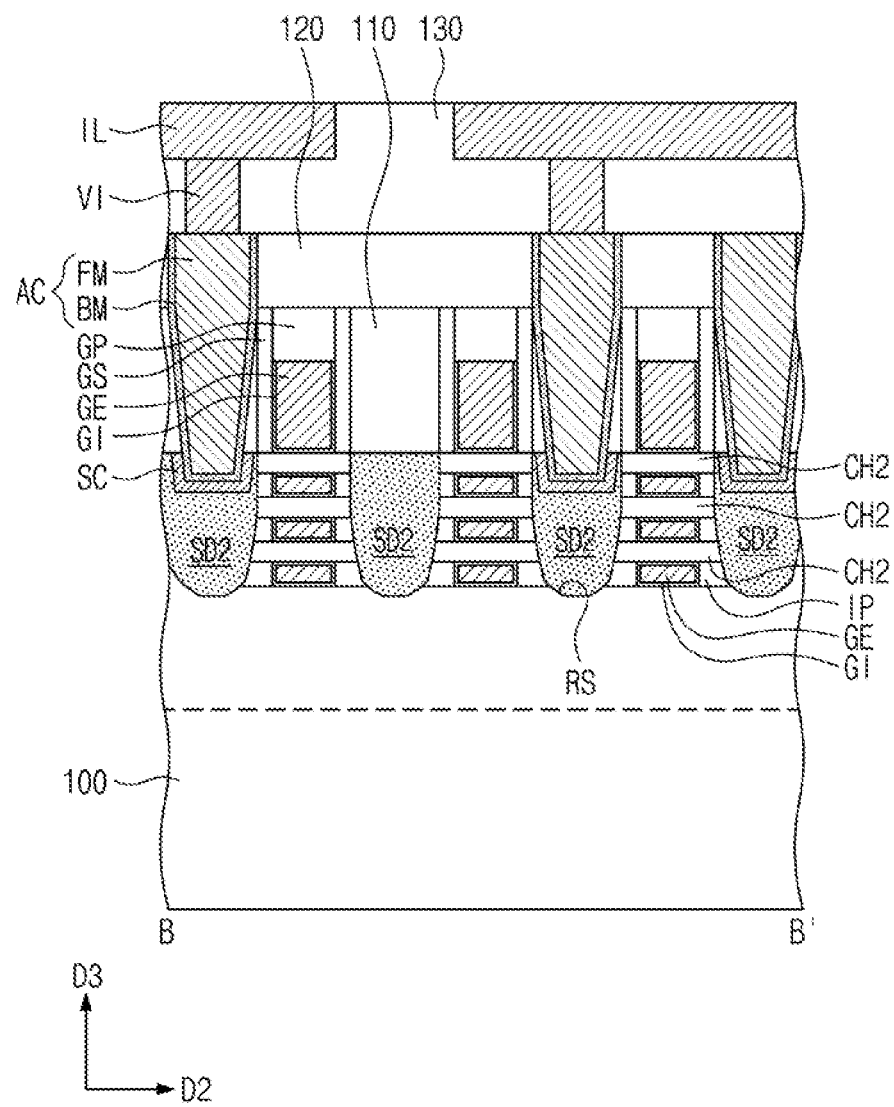
Figure 25C:
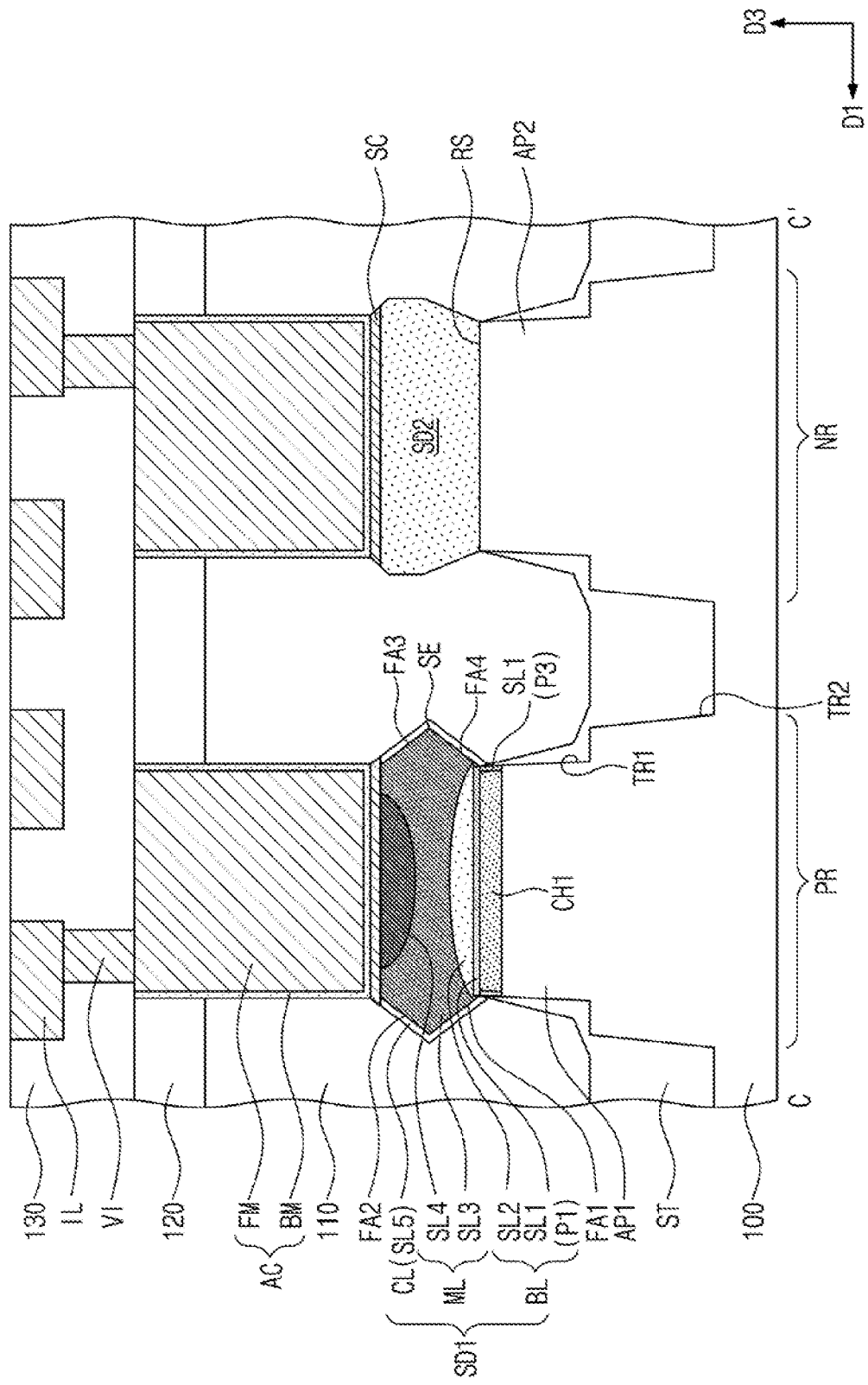
Figure 25D:
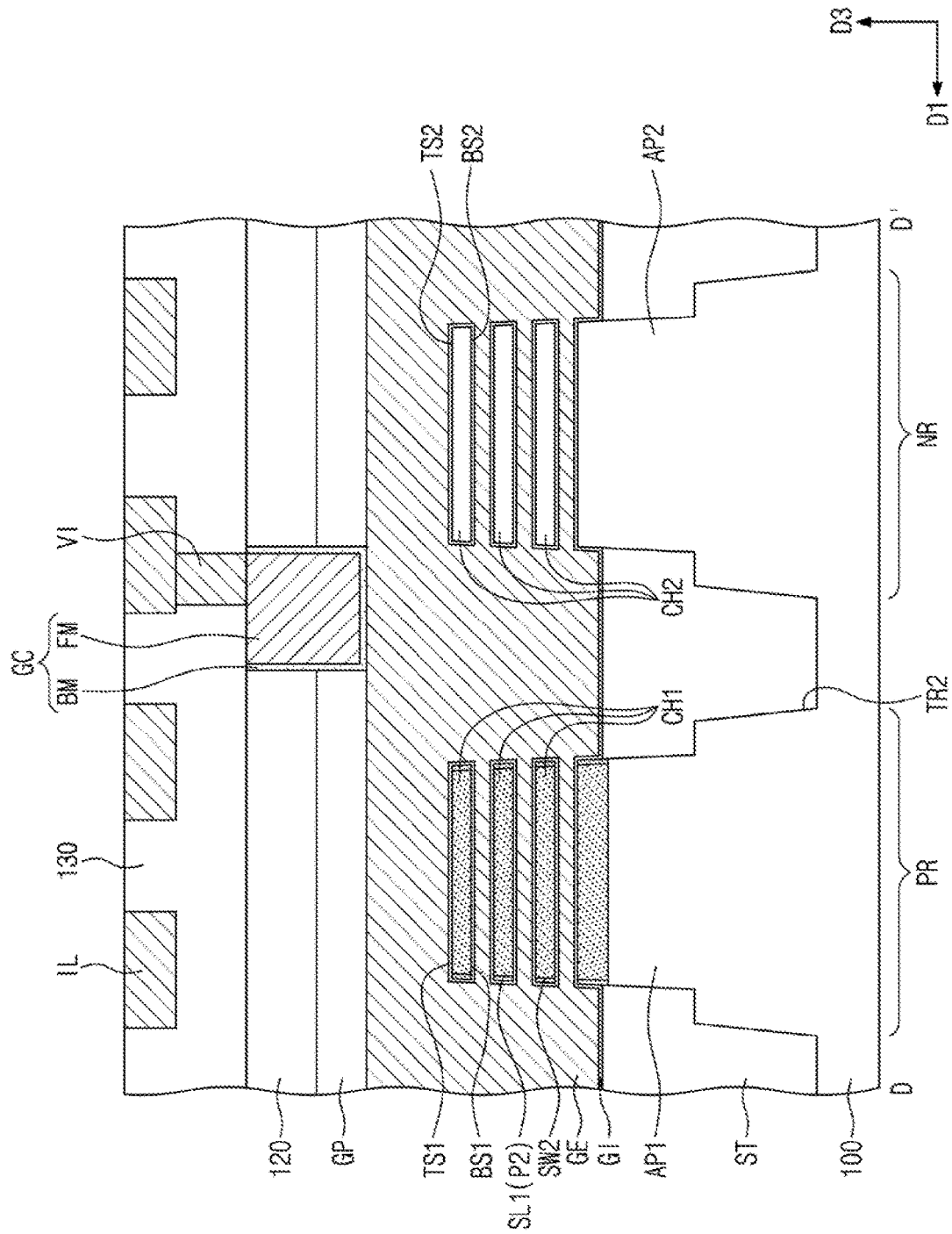

The gate electrode GE may surround each of the first and second channel patterns CH1 and CH2 (e.g., see FIG. 25D). The gate electrode GE may be on the first top surface TS1, at least one side surface, and a first bottom surface BS1 of the first channel pattern CH1. The gate electrode GE may be on the second top surface TS2, at least one side surface, and a second bottom surface BS2 of the second channel pattern CH2. In an implementation, the gate electrode GE may surround the top, bottom, and opposite side surfaces of each of the first and second channel patterns CH1 and CH2. A transistor according to the present embodiment may be a three-dimensional field-effect transistor (e.g., multi-bridge channel field-effect transistor (MBCFET)), in which the gate electrode GE is provided to three-dimensionally surround the channel patterns CH1 and CH2.

The gate dielectric pattern GI may be between each of the first and second channel patterns CH1 and CH2 and the gate electrode GE. The gate dielectric pattern GI may surround each of the first and second channel patterns CH1 and CH2.

The first source/drain patterns SD1 may include the first semiconductor layer SL1, and the first portion P1 of the first semiconductor layer SL1 may cover the first side surfaces SW1 (e.g., see FIGS. 25A and 25C). The first portion P1 may be have substantially the same shape as that in the previous embodiments. The first semiconductor layer SL1 may be between the gate dielectric pattern GI and the first channel patterns CH1. In an implementation, the second portion P2 of the first semiconductor layer SL1 may be between the gate dielectric pattern GI and the first channel patterns CH1. The second portion P2 of the first semiconductor layer SL1 may cover the second side surfaces SW2 of the first channel patterns CH1, as shown in FIG. 25D. Unlike the previous embodiments, the second portion P2 may not be provided on the first top surfaces TS1 of the first channel patterns CH1. In an implementation, referring back to FIG. 7, the second portion P2 according to the present embodiment may include two opposite side portions SP2 and may not have the top portion TP. The third portion P3 may have the same structure as that in the previous embodiments. In an implementation, the second and third portions P2 and P3 may be omitted, as in the embodiments described with reference to FIGS. 8 and 9.

On the second active region NR, an insulating pattern IP may be between the gate dielectric pattern GI and the second source/drain pattern SD2. The gate electrode GE may be spaced apart from the second source/drain pattern SD2 by the gate dielectric pattern GI and the insulating pattern IP. In an implementation, the insulating pattern IP may be omitted on the first active region PR.

The first interlayered insulating layer 110 and the second interlayered insulating layer 120 may be on the substrate 100. The active contacts AC may penetrate the first and second interlayered insulating layers 110 and 120 and may be connected to the first and second source/drain patterns SD1 and SD2, respectively. The gate contact GC may penetrate the second interlayered insulating layer 120 and the gate capping pattern GP and to be connected to the gate electrode GE.

The third interlayered insulating layer 130 may be on the second interlayered insulating layer 120. The first interconnection layer including the interconnection lines IL and the vias VI may be in the third interlayered insulating layer 130.

By way of summation and review, it may be desirable for semiconductor devices to have high reliability, high performance, and/or multiple functions. Increases complexity and/or integration density of semiconductor devices may be considered.

One or more embodiments may provide a semiconductor device including a field effect transistor.

One or more embodiments may provide a semiconductor device with improved electric characteristics.

According to an embodiment, it may be possible to help prevent impurities in a source/drain pattern from being diffused into a channel pattern and thereby to improve an operation property of a semiconductor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate;
a first active pattern on the substrate and extending in a first direction, an upper portion of the first active pattern including at least one first channel pattern;
first source/drain patterns in recesses in an upper portion of the at least one first channel pattern; and
a gate electrode on the first active pattern and extending in a second direction crossing the first direction, the gate electrode being on a top surface and on at least one side surface of the at least one first channel pattern, wherein:
each of the first source/drain patterns includes a first semiconductor layer, a second semiconductor layer, and a third semiconductor layer, which are sequentially provided in the recesses,
each of the at least one first channel pattern, the first semiconductor layer, the second semiconductor layer, and the third semiconductor layer includes silicon-germanium (SiGe), and
the first semiconductor layer has a germanium concentration higher than those of the at least one first channel pattern and the second semiconductor layer.

2. The device as claimed in claim 1, wherein:
the at least one first channel pattern includes a pair of first surfaces facing the first source/drain patterns, and
the first semiconductor layer includes first portions on the first surfaces.

3. The device as claimed in claim 2, wherein:
the at least one first channel pattern includes a plurality of first channel patterns spaced apart from each other in the second direction,
the first portions of the first semiconductor layer are separately and respectively provided on the plurality of first channel patterns, and
the third semiconductor layer is a single layer covering the first portions of the first semiconductor layer separated from each other in the second direction.

4. The device as claimed in claim 3, wherein the second semiconductor layer includes a plurality of portions respectively provided on the first portions of the first semiconductor layer and spaced apart from each other.

5. The device as claimed in claim 2, wherein:
the at least one first channel pattern further includes a pair of second surfaces, which connect the pair of first surfaces to each other and are overlapped with the gate electrode, and
the first semiconductor layer includes second portions provided on the second surfaces.

6. The device as claimed in claim 5, wherein the second portions of the first semiconductor layer are extended to a region below the first portions of the first semiconductor layer to be in contact with bottom surfaces of the first portions of the first semiconductor layer.

7. The device as claimed in claim 5, wherein the first portions of the first semiconductor layer have a different thickness from the second portions of the first semiconductor layer.

8. The device as claimed in claim 5, wherein the second portions of the first semiconductor layer cover a top surface of the at least one first channel pattern.

9. The device as claimed in claim 1, wherein:
the first semiconductor layer is thinner than the second semiconductor layer, and
the second semiconductor layer is thinner than the third semiconductor layer.

10. The device as claimed in claim 9, wherein a thickness of the second semiconductor layer is about two to seven times a thickness of the first semiconductor layer.

11. The device as claimed in claim 9, wherein:
a thickness of the first semiconductor layer ranges from about 1 nm to about 5 nm, and
a thickness of the second semiconductor layer ranges from about 10 nm to about 30 nm.

12. The device as claimed in claim 1, wherein:
each of the first source/drain patterns further includes a fourth semiconductor layer on the third semiconductor layer, and
the fourth semiconductor layer has a germanium concentration higher than that of the third semiconductor layer.

13. The device as claimed in claim 1, wherein:
the first active pattern is on a first active region of the substrate,
the semiconductor device further includes:
   a second active pattern on a second active region of the substrate and extending in the first direction; and
   second source/drain patterns in recesses in an upper portion of the second active pattern,
the first active region is a PMOSFET region, and
the second active region is an NMOSFET region.

14. The device as claimed in claim 1, wherein:
the at least one first channel pattern includes a plurality of first channel patterns, the plurality of first channel patterns being sequentially stacked on the substrate, and
the gate electrode surrounds a top surface, a bottom surface, and both side surfaces of each of the plurality of first channel patterns.

15. A semiconductor device, comprising:
a substrate;
a first active pattern on the substrate and extending in a first direction;
first source/drain patterns in recesses in an upper portion of the first active pattern; and
a gate electrode on the first active pattern and extending in a second direction crossing the first direction, the gate electrode being on a top surface and at least one side surface of the first active pattern,
wherein:
each of the first source/drain patterns includes a first semiconductor layer and a second semiconductor layer, which are sequentially provided in the recesses,
the first semiconductor layer has a germanium concentration higher than that of the second semiconductor layer,
the first active pattern includes a first channel pattern at an upper portion thereof,
the first channel pattern includes a pair of first surfaces that face the first source/drain patterns, and a pair of second surfaces that connect the pair of first surfaces to each other and are overlapped with the gate electrode, and
the first semiconductor layer includes first portions on the first surfaces and second portions on the second surfaces.

16. The device as claimed in claim 15, wherein:
the first channel pattern includes silicon-germanium (SiGe), and
the germanium concentration of the first semiconductor layer is higher than that of the first channel pattern.

17. The device as claimed in claim 15, wherein:
each of the source/drain patterns further includes a third semiconductor layer on the second semiconductor layer,
the first semiconductor layer is thinner than the second semiconductor layer, and
the second semiconductor layer is thinner than the third semiconductor layer.

18. The device as claimed in claim 17, wherein:
each of the first source/drain patterns further includes a fourth semiconductor layer on the third semiconductor layer, and
a germanium concentration of the fourth semiconductor layer is higher than that of the third semiconductor layer.

19. The device as claimed in claim 15, wherein:
the first active pattern is on a first active region of the substrate,
the semiconductor device further includes:
   a second active pattern on a second active region of the substrate to extend in the first direction; and
   second source/drain patterns in recesses in an upper portion of the second active pattern,
the first active region is a PMOSFET region, and
the second active region is an NMOSFET region.

20. A semiconductor device, comprising:
a substrate;
a first active pattern on the substrate and extending in a first direction, an upper portion of the first active pattern including a first channel pattern;
first source/drain patterns in recesses in an upper portion of the first channel pattern;
a gate electrode on the first active pattern and extending in a second direction crossing the first direction, the gate electrode being on a top surface and at least one side surface of the first channel pattern,
an active contact connected to the first source/drain pattern; and
an interface layer between the active contact and the first source/drain pattern,
wherein:
each of the first source/drain patterns includes a first semiconductor layer, a second semiconductor layer, and a third semiconductor layer, which are sequentially provided on the recesses,
each of the first channel pattern, the first semiconductor layer, the second semiconductor layer, and the third semiconductor layer includes silicon-germanium (SiGe),
a germanium concentration of the third semiconductor layer is higher than that of the second semiconductor layer,
a germanium concentration of the first semiconductor layer is higher than those of the first active pattern and the second semiconductor layer,
the first channel pattern includes a pair of first surfaces, which face the first source/drain patterns, and a pair of second surfaces, which connect the pair of first surfaces to each other and are overlapped with the gate electrode, and
the first semiconductor layer includes first portions on the first surfaces and second portions on the second surfaces.

* * * * *